(12) United States Patent
Xu et al.

(10) Patent No.: US 8,551,855 B2
(45) Date of Patent: Oct. 8, 2013

(54) MEMORY CELL THAT INCLUDES A CARBON-BASED REVERSIBLE RESISTANCE SWITCHING ELEMENT COMPATIBLE WITH A STEERING ELEMENT, AND METHODS OF FORMING THE SAME

(75) Inventors: Huiwen Xu, Sunnyvale, CA (US); Er-Xuan Ping, Fremont, CA (US); Xiying Costa, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 360 days.

(21) Appl. No.: 12/834,942

(22) Filed: Jul. 13, 2010

(65) Prior Publication Data

US 2011/0095257 A1 Apr. 28, 2011

Related U.S. Application Data

(60) Provisional application No. 61/254,627, filed on Oct. 23, 2009.

(51) Int. Cl.
*H01L 21/20* (2006.01)

(52) U.S. Cl.
USPC ....... 438/385; 257/E21.004; 257/76; 365/148

(58) Field of Classification Search
USPC .......................................... 365/41, 100, 148
See application file for complete search history.

(56) References Cited

U.S. PATENT DOCUMENTS

| | | |
|---|---|---|
| 4,599,705 A | 7/1986 | Holmberg et al. |
| 5,406,509 A | 4/1995 | Ovshinsky et al. |
| 5,687,112 A | 11/1997 | Ovshinsky |
| 5,751,012 A | 5/1998 | Wolsteinholme et al. |
| 5,825,046 A | 10/1998 | Czubatyj et al. |
| 5,831,276 A | 11/1998 | Gonzalez et al. |
| 5,915,167 A | 6/1999 | Leedy |
| 5,952,671 A | 9/1999 | Reinberg et al. |
| 6,071,597 A | 6/2000 | Yang et al. |
| 6,100,193 A | 8/2000 | Suehiro et al. |
| 6,114,713 A | 9/2000 | Zahorik |

(Continued)

FOREIGN PATENT DOCUMENTS

| | | |
|---|---|---|
| EP | 0 028 707 | 5/1981 |
| EP | 1 892 722 | 2/2008 |

(Continued)

OTHER PUBLICATIONS

Li et al., "Electronic Two-Terminal Bistable Graphitic Memories", Nature Materials, vol. 7, 2008, pp. 966-971.

(Continued)

*Primary Examiner* — Julio J Maldonado
*Assistant Examiner* — Sonya D McCall Shepard
(74) *Attorney, Agent, or Firm* — Dugan & Dugan, PC

(57) ABSTRACT

Memory cells, and methods of forming such memory cells, are provided that include a steering element coupled to a carbon-based reversible resistivity switching material that has an increased resistivity, and a switching current that is less than a maximum current capability of the steering element used to control current flow through the carbon-based reversible resistivity switching material. In particular embodiments, methods and apparatus in accordance with this invention form a steering element, such as a diode, having a first width, coupled to a reversible resistivity switching material, such as aC, having a second width smaller than the first width.

19 Claims, 33 Drawing Sheets

(56) References Cited

U.S. PATENT DOCUMENTS

| | | | |
|---|---|---|---|
| 6,214,107 B1 | 4/2001 | Kitabatake | |
| 6,369,431 B1 | 4/2002 | Gonzalez et al. | |
| 6,388,933 B2 | 5/2002 | Marr | |
| 6,563,220 B2 | 5/2003 | Gonzalez et al. | |
| 6,643,159 B2 | 11/2003 | Fricke et al. | |
| 6,670,713 B2 | 12/2003 | Gonzalez et al. | |
| 6,744,088 B1 | 6/2004 | Dennison | |
| 6,841,846 B1 | 1/2005 | Chen et al. | |
| 6,885,021 B2 | 4/2005 | Apodaca et al. | |
| 6,937,507 B2 | 8/2005 | Chen | |
| 6,952,030 B2 | 10/2005 | Herner | |
| 6,960,495 B2 | 11/2005 | Vyvoda et al. | |
| 6,984,561 B2 | 1/2006 | Herner et al. | |
| 6,995,422 B2 | 2/2006 | Herner et al. | |
| 7,009,275 B2 | 3/2006 | Herner et al. | |
| 7,026,212 B2 | 4/2006 | Herner et al. | |
| 7,084,062 B1 | 8/2006 | Avanzino et al. | |
| 7,176,064 B2 | 2/2007 | Herner | |
| 7,205,562 B2 | 4/2007 | Wicker | |
| 7,238,607 B2 | 7/2007 | Dunton et al. | |
| 7,259,038 B2 | 8/2007 | Scheuerlein et al. | |
| 7,265,049 B2 | 9/2007 | Herner et al. | |
| 7,271,440 B2 | 9/2007 | Harshfield | |
| 7,285,464 B2 | 10/2007 | Herner et al. | |
| 7,301,191 B1 | 11/2007 | Tombler et al. | |
| 7,345,296 B2 | 3/2008 | Tombler, Jr. et al. | |
| 7,361,586 B2 | 4/2008 | Adem et al. | |
| 7,405,465 B2 | 7/2008 | Herner | |
| 7,417,245 B2 | 8/2008 | Happ et al. | |
| 7,426,128 B2 | 9/2008 | Scheuerlein | |
| 7,483,285 B2 | 1/2009 | Furukawa et al. | |
| 7,575,984 B2 | 8/2009 | Radigan | |
| 7,602,042 B2 | 10/2009 | Ahn et al. | |
| 7,705,343 B2 | 4/2010 | Suh et al. | |
| 7,728,405 B2 | 6/2010 | Kreupl | |
| 7,830,698 B2 | 11/2010 | Chen et al. | |
| 7,955,981 B2 | 6/2011 | Chen et al. | |
| 8,023,310 B2 | 9/2011 | Fu et al. | |
| 8,039,919 B2 | 10/2011 | Moon et al. | |
| 8,093,123 B2 | 1/2012 | Xu et al. | |
| 8,114,765 B2 | 2/2012 | Xu et al. | |
| 8,206,995 B2 | 6/2012 | Reyes et al. | |
| 2003/0073295 A1 | 4/2003 | Xu | |
| 2004/0159835 A1 | 8/2004 | Krieger et al. | |
| 2004/0251551 A1 | 12/2004 | Hideki | |
| 2005/0052915 A1 | 3/2005 | Herner et al. | |
| 2005/0158950 A1 | 7/2005 | Scheuerlein et al. | |
| 2005/0226067 A1 | 10/2005 | Herner et al. | |
| 2006/0046407 A1 | 3/2006 | Juengling | |
| 2006/0097342 A1 | 5/2006 | Parkinson | |
| 2006/0118782 A1 | 6/2006 | Zettl et al. | |
| 2006/0175596 A1 | 8/2006 | Happ et al. | |
| 2006/0250836 A1 | 11/2006 | Herner | |
| 2006/0258109 A1 | 11/2006 | Juengling | |
| 2006/0273298 A1 | 12/2006 | Petti | |
| 2007/0034936 A1 | 2/2007 | Van Schaijk et al. | |
| 2007/0123053 A1 | 5/2007 | Kim et al. | |
| 2007/0190722 A1 | 8/2007 | Herner | |
| 2008/0017894 A1 | 1/2008 | Happ et al. | |
| 2008/0070162 A1 | 3/2008 | Ufert | |
| 2008/0116441 A1 | 5/2008 | Raghuram | |
| 2008/0173858 A1 | 7/2008 | An et al. | |
| 2008/0217732 A1 | 9/2008 | Kreupl | |
| 2008/0232160 A1* | 9/2008 | Gopalakrishnan | 365/163 |
| 2009/0108368 A1 | 4/2009 | Kanegae et al. | |
| 2009/0168491 A1 | 7/2009 | Schricker | |
| 2009/0201715 A1* | 8/2009 | Kreupl | 365/148 |
| 2009/0257265 A1 | 10/2009 | Chen et al. | |
| 2009/0257270 A1 | 10/2009 | Schricker | |
| 2009/0262572 A1 | 10/2009 | Krusin-Elbaum | |
| 2009/0294832 A1 | 12/2009 | Kakoschke et al. | |
| 2010/0006811 A1 | 1/2010 | Xu | |
| 2010/0006812 A1 | 1/2010 | Xu | |
| 2010/0012914 A1 | 1/2010 | Xu et al. | |
| 2010/0032638 A1 | 2/2010 | Xu | |
| 2010/0032639 A1 | 2/2010 | Xu | |
| 2010/0032640 A1 | 2/2010 | Xu | |
| 2010/0032643 A1 | 2/2010 | Xu | |
| 2010/0038620 A1 | 2/2010 | Xu et al. | |
| 2010/0038623 A1 | 2/2010 | Xu et al. | |
| 2010/0081268 A1 | 4/2010 | Schricker et al. | |
| 2010/0102291 A1 | 4/2010 | Xu | |
| 2010/0108976 A1 | 5/2010 | Jayasekara et al. | |
| 2010/0108982 A1 | 5/2010 | Ping et al. | |
| 2010/0163824 A1 | 7/2010 | Xu et al. | |
| 2010/0176366 A1 | 7/2010 | Fu et al. | |
| 2010/0193916 A1 | 8/2010 | Xu et al. | |
| 2010/0291747 A1* | 11/2010 | Lung et al. | 438/382 |
| 2010/0327254 A1 | 12/2010 | Chen et al. | |
| 2011/0037045 A1 | 2/2011 | Fukumizu et al. | |
| 2011/0095258 A1 | 4/2011 | Xu et al. | |
| 2011/0117679 A1 | 5/2011 | Lee et al. | |
| 2011/0204313 A1 | 8/2011 | Chen et al. | |
| 2011/0278529 A1 | 11/2011 | Xu | |
| 2012/0135603 A1 | 5/2012 | Xu et al. | |

FOREIGN PATENT DOCUMENTS

| | | |
|---|---|---|
| EP | 1 916 722 | 4/2008 |
| JP | 2009 218259 | 9/2009 |
| WO | WO 2004/070735 | 8/2004 |
| WO | WO 2006/078505 A2 | 7/2006 |
| WO | WO 2008/078197 | 7/2008 |
| WO | WO 2009/043023 A2 | 4/2009 |
| WO | WO 2009/088889 | 7/2009 |
| WO | WO 2009/110120 | 9/2009 |
| WO | WO 2009/126846 | 10/2009 |
| WO | WO 2009/126891 | 10/2009 |
| WO | WO 2010/017428 | 2/2010 |

OTHER PUBLICATIONS

Maxwell, U.S. Appl. No. 12/703,907, filed Feb. 11, 2010.

Li et al., U.S. Appl. No. 12/631,913, filed Dec. 7, 2009.

Franz Kreupl et al., U.S. Appl. No. 12/711,810, filed Feb. 24, 2010.

Li et al., U.S. Appl. No. 12/714,359, filed Feb. 26, 2010.

Kreupl et al., "Carbon-Based Resistive Memory", Jun. 26, 2008, IEDM 2008, pp. 1-4.

Gateru et al., "Memory Switching in Ion Bombarded Amorphous Silicon Carbide Thin Film Devices", 2003, Materials Research Society, Mat. Res. Soc. Symp. Proc., vol. 742, pp. 79-83.

Shannon et al., "Memory Switching in Amorphous Silicon-Rich Silicon Carbide", Oct. 28, 1999, Electronics Letters, vol. 35, No. 22, pp. 1976-1978.

Kreupl et al., U.S. Appl. No. 12/760,156, filed Apr. 14, 2010.

Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.

Takai et al.,"Structure and Electronic Properties of a Nongraphitic Disordered Carbon System and its Heat-Treatment Effects", Physical Review B 67, 214202, pp. 214202-1-214202-11, published Jun. 19, 2003.

Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.

Dittmer et al., "Low ambient temperature CVD growth of carbon nanotubes," Appl. Phys. A 84,243-246 (2006), p. 1, published online May 17, 2006.

Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.

Kong et al., "Integration of a gate electrode into carbon nanotube devices for scanning tunneling microscopy," Appl. Phys. Lett. 86, 2005, pp. 112106-1-112106-3, published online Mar. 8, 2005.

Bhattacharyya, et al., "Switching behaviour and high frequency response of amorphous carbon double-barrier structures", Aug. 2007, Materials Science and Engineering C, Elsevier Science S.A, CH, vol. 27 No. 5-8, pp. 957-960, available online Nov. 13, 2006.

International Search Report and Written Opinion of International Application No. PCT/US2010/052859 dated Feb. 7, 2011.

Sin, C-Y et al., "Resist trimming in high-density CF4/02 Plasmas for sub-0.1 [mu]m device fabrication", Jour. Vacuum Sci. & Techno. B (Microelectronics and Nanometer Structures) AIP for American Vacuum Soc. USA, vol. 20, No. 5, pp. 1974-1981, 2002.

Eyoum, M-A et al., "Ashing Technique for Nano-Gap Fabrication of Electrostatic Transducers", Materials Research Society Symposium Proceedings; [Materials Research Society Symposium Proceedings], Materials Research Society, USA, vol. EXS-02, pp. 145-147, 2003.

International Search Report and Written Opinion of International Application No. PCT/US2010/052855 dated Feb. 2, 2011.

Restriction Requirement of related U.S. Appl. No. 12/835,236 mailed Jun. 12, 2012.

Notice of Allowance of related U.S. Appl. No. 12/835,236 mailed Dec. 11, 2012.

Jul. 12, 2012 Response to Jun. 12, 2012 Restriction Requirement of related U.S. Appl. No. 12/835,236.

Office Action of related U.S. Appl. No. 12/835,236 mailed Aug. 7, 2012.

Nov. 7, 2012 Response to Aug. 7, 2012 Office Action of related U.S. Appl. No. 12/835,236.

Notice of Allowance of related U.S. Appl. No. 12/835,236 mailed Apr. 3, 2013.

\* cited by examiner

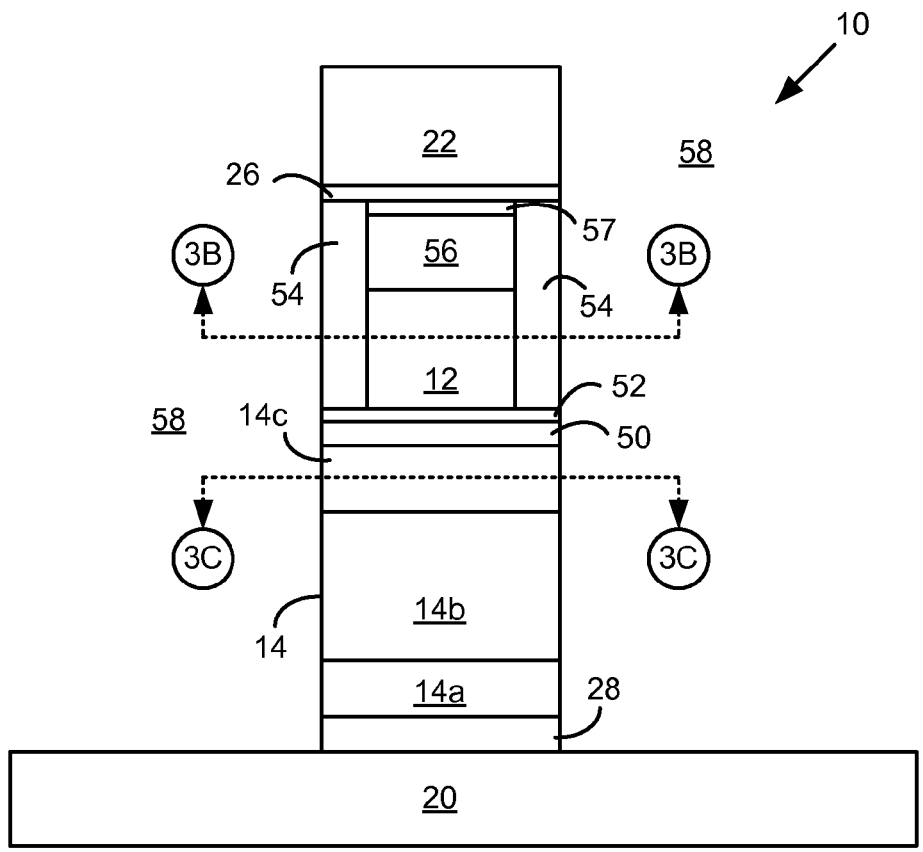
FIG. 3A
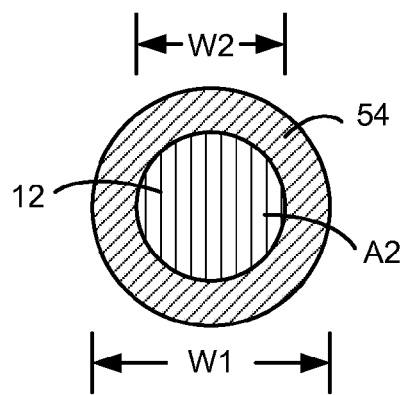
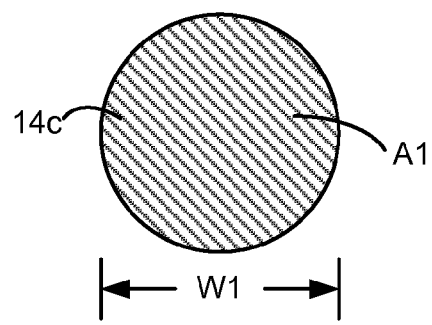
FIG. 3B  FIG. 3C

MEMORY CELL THAT INCLUDES A CARBON-BASED REVERSIBLE RESISTANCE SWITCHING ELEMENT COMPATIBLE WITH A STEERING ELEMENT, AND METHODS OF FORMING THE SAME

REFERENCE TO RELATED APPLICATIONS

This application claims the benefit of U.S. Provisional Patent Application Ser. No. 61/254,627, filed Oct. 23, 2009, and titled "A Memory Cell That Includes A Carbon-Based Reversible Resistance Switching Element Compatible With A Steering Element, And Methods Of Forming The Same," which is incorporated by reference herein in its entirety for all purposes.

This application is related to U.S. patent application Ser. No. 12/835,236, filed Jul. 13, 2010, and titled "A Memory Cell That Includes A Carbon-Based Reversible Resistance Switching Element Compatible With A Steering Element, And Methods Of Forming The Same," which is incorporated by reference herein in its entirety for all purposes.

TECHNICAL FIELD

This invention relates to non-volatile memories, and more particularly to a memory cell that includes a carbon-based reversible resistance switching element compatible with a steering element, and methods of forming the same.

BACKGROUND

Non-volatile memories formed from reversible resistance switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity switching material.

However, fabricating memory devices from rewriteable resistivity switching materials is technically challenging, and improved methods of forming memory devices that employ resistivity switching materials are desirable.

SUMMARY

In a first aspect of the invention, a method of forming a memory cell is provided, the method including forming a steering element having a first width, and forming a reversible resistance switching element coupled to the steering element, wherein the reversible resistance switching element has a second width smaller than the first width.

In a second aspect of the invention, a method of forming a memory cell is provided, the method including forming a steering element having a first width, forming a reversible resistance switching element coupled to the steering element, forming a masking feature, shrinking the masking feature to a width less than the first width, and reducing a width of the reversible resistance switching element to a second width substantially equal to the shrunken masking feature width by employing the shrunken mask feature.

In a third aspect of the invention, a method of forming a memory cell is provided, the method including forming a steering element having a first width, forming a cavity adjacent the steering element, wherein the cavity has a width smaller than the first width, and using the cavity to form a reversible resistance switching element coupled to the steering element, wherein the reversible resistance switching element has a second width substantially equal to the cavity width.

In a fourth aspect of the invention, a memory cell is provided that includes a first conductor, a steering element disposed above the first conductor, wherein the steering element has a first width, a reversible resistance switching element disposed above the first conductor and coupled to the steering element, wherein the reversible resistance switching element has a second width smaller than the first width, and a second conductor formed above the reversible resistance switching element.

In a fifth aspect of the invention, a method of forming a memory cell is provided, the method including forming a steering element above a substrate, wherein the steering element has a maximum current capability, and forming a reversible resistance switching element coupled to the steering element, wherein the reversible resistance switching element has a switching current that is less than the maximum current capability.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIG. 3A is a cross-sectional view of an exemplary embodiment of the memory cell of FIG. 2A;

FIG. 3B is a cross-sectional view as indicated by the line 3B-3B as shown in FIG. 3A;

FIG. 3C is a cross-sectional view as indicated by the line 3C-3C as shown in FIG. 3A;

DETAILED DESCRIPTION

Some carbon-based materials exhibit reversible resistivity switching properties that may be suitable for use in nonvolatile memories. As used herein, carbon-based materials may include amorphous carbon ("aC"), graphene, graphite, and other crystalline forms of carbon, either alone or in combination with secondary materials. Diamond-like carbon, which tends to appear at temperatures lower than 500° C., to be $sp^3$-hybridized, and to be amorphous with respect to long range order, also has been found to be switchable.

Carbon-based materials have demonstrated memory switching properties on lab-scale devices with a 100× separation between ON and OFF states and mid-to-high range resistance changes. Such a separation between ON and OFF states renders carbon-based materials viable candidates for memory cells in which the carbon-based material is coupled in series with vertical diodes, thin film transistors or other steering elements. For example, a metal-insulator-metal ("MIM") stack formed from a carbon-based material sandwiched between two metal or otherwise conducting layers may serve as a resistance change element for a memory cell.

Carbon-based materials are often deposited using plasma-enhanced chemical vapor deposition ("PECVD") techniques. Such material may have an "initial resistivity" (i.e., the resistivity of the material as formed) that may be low relative to the resistivities of the surrounding materials. As a result, a resistance change element that includes the carbon-based material may conduct a high initial current that is incompatible with a steering element used to control current flow through the resistance change element, such as an adjacent diode. Additionally or alternatively, the initial resistivity of the carbon-based material may require a high voltage and current to reset the material upon initial use.

To avoid these problems, methods and apparatus in accordance with this invention form a carbon-based reversible resistivity switching element that has an increased resistance, and a switching current that is less than the maximum current capability of a steering element used to control current flow through the carbon-based reversible resistance switching element. In particular, methods and apparatus in accordance with this invention form a steering element, such as a diode, having a first cross-sectional area, coupled to a reversible resistance switching element having a second cross-sectional area smaller than the first cross-sectional area. A reduced cross-sectional area for the reversible resistivity switching element increases a resistance of the reversible resistance switching element, and thereby decreases initial current flow through the reversible resistance switching element.

Exemplary Inventive Memory Cell

Figure 1:
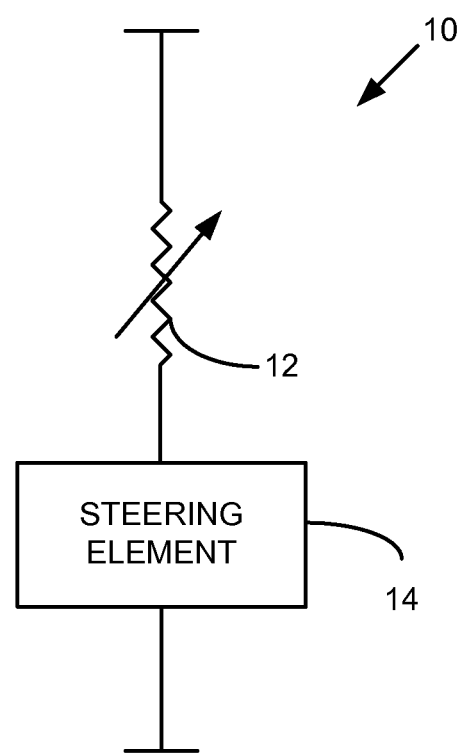
FIG. 1 is a diagram of an exemplary memory cell in accordance with this invention.

FIG. 1 is a schematic illustration of an exemplary memory cell 10 in accordance with this invention. Memory cell 10 includes a reversible resistance switching element 12 coupled to a steering element 14. Reversible resistance switching element 12 includes a reversible resistivity switching material (not separately shown) having a resistivity that may be reversibly switched between two or more states.

For example, the reversible resistivity switching material of element 12 may be in an initial, low-resistivity state upon fabrication. Upon application of a first voltage and/or current, the material is switchable to a high-resistivity state. Application of a second voltage and/or current may return the reversible resistivity switching material to a low-resistivity state. Alternatively, reversible resistance switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used. Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 14 may include a thin film transistor, a diode, or another similar steering element that exhibits non-ohmic conduction by selectively limiting the voltage across and/or the current flow through reversible resistance switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance switching element 12 and steering element 14 are described below with reference to FIGS. 2A-2D.

Exemplary Embodiments of Memory Cells and Memory Arrays

Figure 2A:
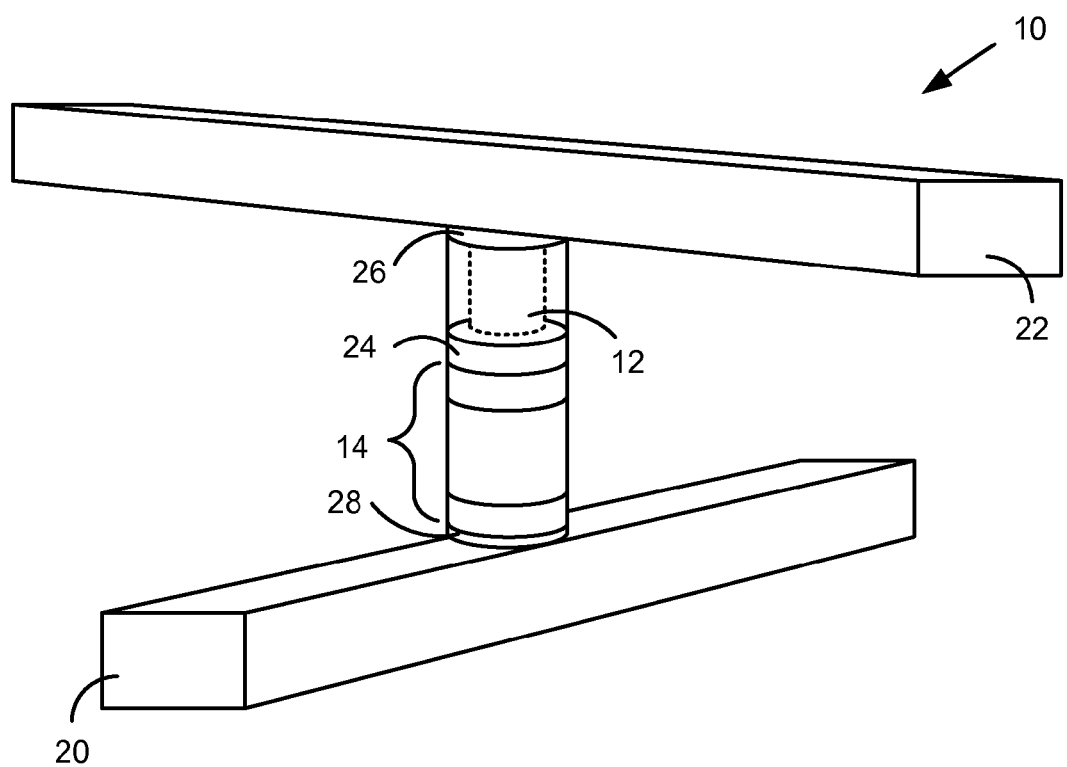
FIG. 2A is a simplified perspective view of an exemplary memory cell in accordance with this invention.

FIG. 2A is a simplified perspective view of an exemplary embodiment of a memory cell 10 in accordance with this invention in which steering element 14 is a diode. Memory cell 10 includes a reversible resistance switching element 12 coupled in series with a diode 14 between a first conductor 20 and a second conductor 22. In some embodiments, a barrier layer 24 may be formed between reversible resistance switching element 12 and diode 14, and a barrier layer 26 may be formed between reversible resistance switching element 12 and second conductor 22. For example, barrier layers 24 and 26 may include titanium nitride, tantalum nitride, tungsten nitride, or another similar barrier layer.

As will be described in more detail below, in some embodiments, barrier layers 24 and/or 26 may serve as a hard mask during formation of diode 14. Use of metal hard masks is described, for example, in U.S. patent application Ser. No. 11/444,936, filed May 13, 2006 and titled "Conductive Hard Mask To Protect Patterned Features During Trench Etch" (the "'936 Application") which is hereby incorporated by reference herein in its entirety for all purposes. An additional barrier layer 28, such as titanium nitride, tantalum nitride, tungsten nitride, etc., also may be formed between diode 14 and first conductor 20.

Diode 14 may include any suitable diode such as a vertical polycrystalline p-n or p-i-n diode, whether upward pointing with an n-region above a p-region of the diode or downward pointing with a p-region above an n-region of the diode. Exemplary embodiments of diode 14 are described below with reference to FIG. 3.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

As described in more detail below, diode 14 has a first cross-sectional area A1 (not shown), and reversible resistance switching element 12 has a second cross-sectional area A2 (not shown) smaller than first cross-sectional area A1. Second cross-sectional area A2 is selected to be smaller than first cross-sectional area A1 so that the maximum switching current of reversible resistance switching element 12 is less than the maximum current capability of diode 14.

In particular, reversible resistance switching element 12 may be fabricated to have a cross-sectional area that is less than a corresponding cross-sectional area of diode 14 so that the maximum switching current of reversible resistance switching element 12 is less than the maximum current capability of diode 14. In accordance with this invention, second cross-sectional area A2 may be from about 10%-50%, more generally from about 10%-90%, of first cross-sectional area A1. In at least one exemplary embodiment, second cross-sectional area A2 is about 25% of first cross-sectional area A1.

Figure 2B:
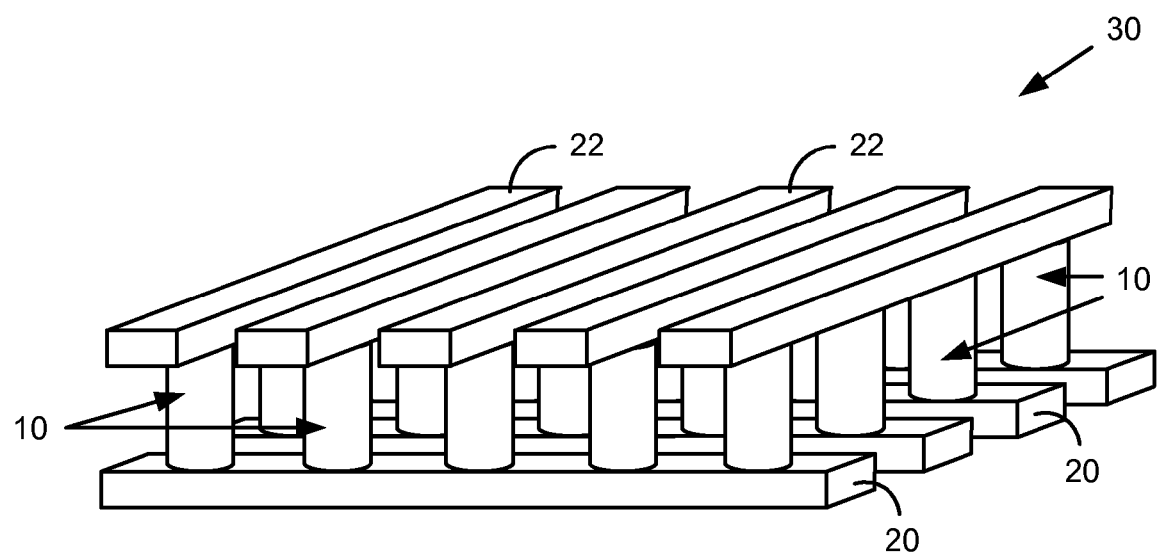
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cells 10 of FIG. 2A. For simplicity, reversible resistance switching element 12, diode 14, and barrier layers 24, 26 and 28 are not separately shown. Memory array 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
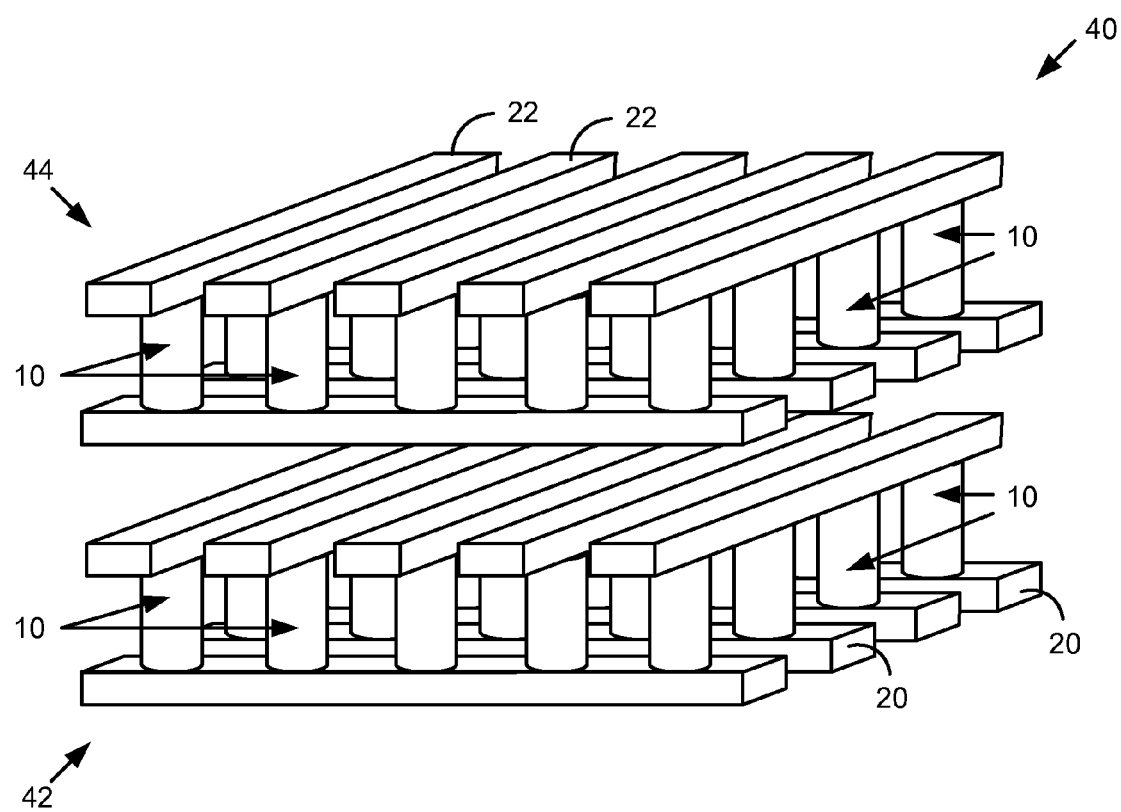
FIG. 2C is a simplified perspective view of a portion of a first exemplary three-dimensional memory array in accordance with this invention.

For example, FIG. 2C is a simplified perspective view of a portion of a monolithic three dimensional array 40 that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
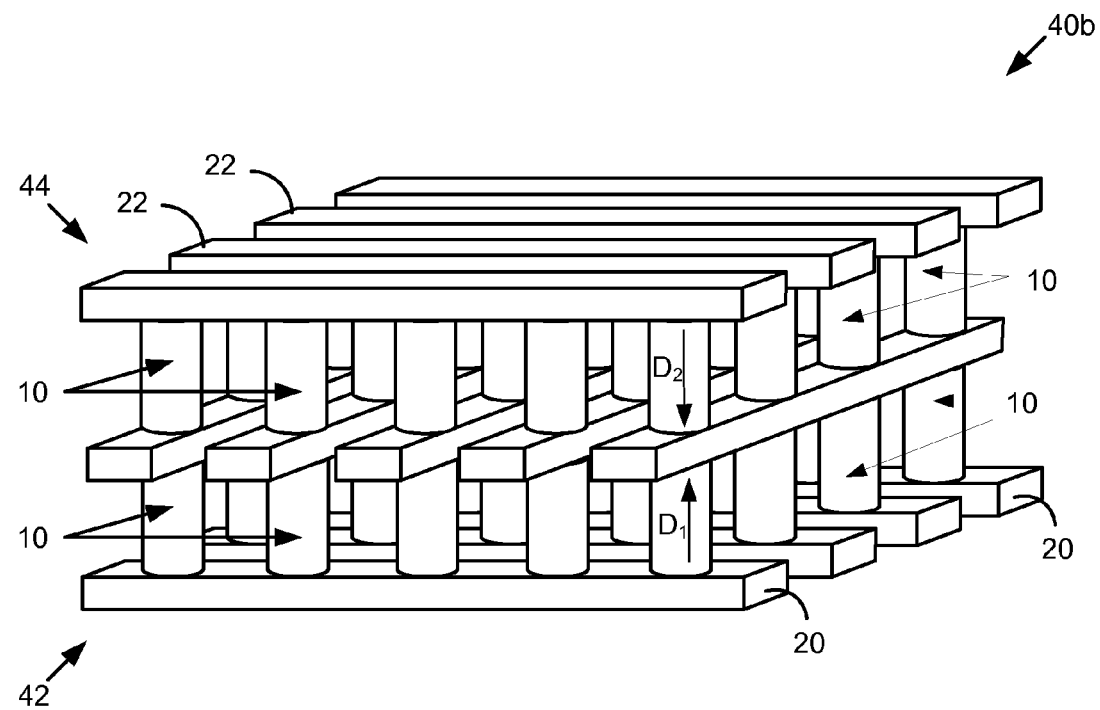
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell" which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

As described above in connection with FIG. 2A, methods and apparatus in accordance with this invention form reversible resistance switching element 12 so that its switching current is compatible with diode 14. In particular, methods and apparatus in accordance with this invention increase the resistance of reversible resistance switching element 12 so that the maximum switching current of reversible resistance switching element 12 is less than the maximum current capability of diode 14. As is well known, resistance is related to a material's resistivity, $\rho$, by the equation:

$$R = \rho t/A$$

where $\rho$=resistivity, t=material thickness and A=cross sectional area

By decreasing the cross-sectional area of the switching material that forms the reversible resistance switching element 12, the resistance of the reversible resistance switching element 12 is increased. In this manner, the switching current of the reversible resistance switching element decreases.

As stated, any suitable carbon-based switching material may be used as reversible resistance switching element 12. In some embodiments, a preferred resistivity of the material used to form the reversible resistance switching element 12 is at least $1 \times 10^3$ ohm-cm when reversible resistance switching element 12 is in an ON-state, whereas a preferred resistivity of the material used to form reversible resistance switching element 12 is at least $1 \times 10^4$ ohm-cm when reversible resistance switching element 12 is in an OFF-state.

FIG. 3A is a cross-sectional view of a first exemplary embodiment of memory cell 10 of FIG. 2A. With reference to FIG. 3, memory cell 10 includes reversible resistance switching element 12, diode 14, and first and second conductors 20 and 22, respectively. Memory cell may also include barrier layers 26, 28 and 56, a silicide layer 50, a silicide-forming metal layer 52, dielectric layers 54 and 58, and metal layer 57, as well as adhesion layers, antireflective coating layers and/or the like (not shown) which may be used with first and/or second conductors 20 and 22, respectively, to improve device performance and/or facilitate device fabrication.

As previously stated, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 Application"), which is hereby incorporated by reference herein in its entirety for all purposes. In some embodiments, a few hundred angstroms or less of silicon-germanium alloy with about 10 at % or more of germanium may be employed.

A barrier layer 28, such as titanium nitride, tantalum nitride, tungsten nitride, etc., may be formed between first conductor 20 and the n+ region 14a (e.g., to prevent and/or reduce migration of metal atoms into the polysilicon regions). Similarly, a barrier layer 26, such as titanium nitride, tantalum nitride, tungsten nitride, etc., may be formed between second conductor 22 and a dielectric layer 54 and a barrier layer 56 to prevent and/or reduce migration of metal atoms into reversible resistance switching element 12. As mentioned above, in some embodiments, an additional metal layer (not shown) may be formed between barrier layer 26 and second conductor 22.

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c. In some embodiments, an additional nitride layer (not shown) may be formed at a top surface of silicide-forming metal layer 52. In particular, for highly reactive metals, such as titanium, an additional cap layer such as TiN layer may be formed on silicide-forming metal layer 52. Thus, in such embodiments, a Ti/TiN stack is formed on top of p+ polysilicon region 14c.

A rapid thermal anneal ("RTA") step may then be performed to form silicide regions by reaction of silicide-forming metal layer 52 with p+ region 14c. The RTA may be performed at about 540° C. for about 1 minute, and causes silicide-forming metal layer 52 and the deposited silicon of diode 14 to interact to form silicide layer 50, consuming all or a portion of the silicide-forming metal layer 52. As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 50 enhances the crystalline structure of silicon diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

As shown in FIGS. 3B and 3C, diode 14 and reversible resistance switching element 12 have substantially circular cross-sectional shapes. Diode 14 has a width (and diameter) W1 and a first cross-sectional area A1, and reversible resistance switching element 12 has a width (and diameter) W2, and a second cross-sectional area A2. Accordingly, $$A1 = \pi \times (r1)^2 \quad (1)$$

$$A2 = \pi \times (r2)^2 \quad (2)$$

where r1=(W1)/2 and r2=(W2)/2. Persons of ordinary skill in the art will understand that if diode 14 and reversible resistance switching element 12 have non-circular cross-sectional shapes, alternative formulas may be used to calculate cross-sectional areas A1 and A2.

As described above, in accordance with this invention, second cross-sectional area A2 is selected to be smaller than first cross-sectional area A1, so that the maximum switching current of reversible resistance switching element 12 is less than the maximum current capability of diode 14. Thus, width W2 of reversible resistance switching element 12 is selected to be smaller than width W1 of diode 14. For example, if it is desired that A2=αA1, with α<1, then from equations (1) and (2), $$W2 = \alpha^{1/2} \times W1 \quad (3)$$

Thus, if α=0.25, W2=0.5×W1. In various exemplary embodiments, W1 is between about 10 nm and about 100 nm, and W2 is between about 5 nm and about 50 nm. In other exemplary embodiments, W1 is between about 10 nm and about 45 nm, and W2 is between about 5 nm and about 20 nm. In at least one exemplary embodiment, W1 is about 43 nm and W2 is about 19 nm. In at least one alternative exemplary embodiment, W1 is about 24 nm and W2 is about 12 nm. Other W1 and/or W2 values may be used.

As shown in FIG. 3, reversible resistance switching element 12 is substantially planar (e.g., formed without any intentionally formed cavities). That is, no processing steps are used to expressly form hollows, voids, channels, grooves, openings or other similar cavities in reversible resistance switching element 12.

Reversible resistance switching element 12 may be formed from a carbon-based material. For example, in some embodiments, reversible resistance switching element 12 is formed from an aC material. Any suitable thickness may be employed for the carbon-based material. In one embodiment, an aC material thickness of about 50-800 angstroms may be used. In some embodiments, a preferred thickness of the carbon material may be about 100-600 angstroms. In other embodiments, a preferred thickness of the carbon material may be about 400 angstroms or less.

Table 1 below describes an exemplary process window for forming a carbon-based switching layer within a PECVD chamber using a processing gas comprising one or more hydrocarbon compounds and a carrier/dilutant gas. Persons of ordinary skill in the art will understand that the carrier gas may comprise any suitable inert or non-reactive gas such as one or more of He, Ar, $H_2$, Kr, Xe, $N_2$, etc. In some embodiments, the hydrocarbon compounds may have the formula $C_xH_y$, with x ranging from about 2 to 4, and y ranging from about 2 to 10.

TABLE 1

EXEMPLARY PECVD PROCESS PARAMETERS

| PROCESS PARAMETER | EXEMPLARY RANGE | PREFERRED RANGE |
|---|---|---|
| Precursor Flow Rate (sccm) | 10-5000 | 50-2000 |
| Carrier Flow Rate (sccm) | 10-10000 | 1000-7000 |
| Carrier/Precursor Ratio | 1:1-100:1 | 1:1-50:1 |
| Chamber Pressure (Torr) | 0.8-10 | 2.5-7 |
| $1^{st}$ RF frequency (Mhz) | 10-50 | 13.5 |
| $2^{nd}$ RF frequency (Khz) | 90-500 | 90 |
| RF Power Density (W/in$^2$) | 0.1-20 | 0.3-5 |
| $2^{nd}$ RF/$1^{st}$ RF Power Density Ratio | 0-1 | 0-0.5 |
| Process Temperature (° C.) | 100-900 | 300-550 |
| Electrode Spacing (Mils) | 200-1000 | 200-500 |

In particular embodiments, carbon-based switching materials may be formed to exhibit sheet resistance ("$\Omega/\square$" or "ohms/square") for a 1000 angstrom film from about $1 \times 10^4 \Omega/\square$ to about $1 \times 10^7 \Omega/\square$, and more preferably about $1 \times 10^4 \Omega/\square$ or greater. Similarly, some embodiments may comprise an aC film with nanocrystallites.

Other film parameters and characteristics may be pursued as well (e.g., alternate values of deposition rate, film thickness, sheet resistance/resistivity, etc.). For example, an exemplary carbon-based switching layer has the following characteristics:

TABLE 2

EXEMPLARY PECVD C-BASED FILM RESULTS

| PROCESS PARAMETER | EXEMPLARY RANGE | PREFERRED RANGE |
|---|---|---|
| Deposition Rate (Å/sec) | ≤33 | ≤5 |
| Total Film Thickness (Ang) | ≤1000 | ≤500 |
| Crystallinity (vol %) | >5% | >30% |
| Crystallinity Size (nm) | >1 | 2-10 |
| Sheet Resist. (ohm/square) | $>1 \times 10^3$ | $>1 \times 10^4$ |

As described above, reversible resistance switching element 12 has a width W2 that is less than width W1 of diode 14. As described in more detail below, reversible resistance switching element 12 may be fabricated by forming a masking feature (e.g., a photoresist mask) having width W1 (e.g., by patterning and developing a layer of photoresist using a mask designed to form diode 14), shrinking the masking feature to a width W2, and then patterning and etching reversible resistance switching element 12 to width W2 using the shrunken masking feature.

In some exemplary methods in accordance with this invention, described in more detail with respect to FIGS. 4A-4I, dielectric layer 54, barrier layer 56 and metal layer 57 may be used as a hard mask during formation of diode 14. For example, dielectric layer 54, reversible resistance switching element 12, barrier layer 56 and metal layer 57 may be patterned and etched, and then serve as a mask during etching of diode 14. Patterning and etching of dielectric layer 54, barrier layer 56, metal layer 57, silicide layer 50, silicide-forming metal layer 52 and diode 14 and barrier layer 28 creates a pillar structure 60. Dielectric material 58 is deposited on top of and around pillar structure 60 to isolate pillar structure 60 from other similar pillar structures of other similar memory cells (not shown) fabricated on a memory level that includes memory cell 10.

In alternative exemplary methods in accordance with this invention, described in more detail with respect to FIG. 5, a sacrificial layer (not shown) may be formed above diode 14, and the sacrificial layer and diode layers may be patterned and etched to width W1 using a diode mask to form a pillar. A dielectric layer may be deposited on top of and around the pillar, and the sacrificial layer may be removed, to create a void. A conformal liner may be deposited in the void, and an anisotropic etch may be used to remove lateral portions of liner material. The resulting vertical portions of the liner may narrow the width of the void to W2. Reversible resistance switching element 12 may then be formed in the remaining void to a width W2.

In still other exemplary methods in accordance with this invention, described in more detail with respect to FIGS. 6 and 7, reversible resistance switching element 12 is formed by depositing a carbon-based switching material such as an aC layer, patterning and etching reversible resistance switching element 12 to width W1, and then shrinking reversible resistance switching element 12 to width W2.

Exemplary Fabrication Processes for Memory Cells

Referring now to FIGS. 4A-D, a first exemplary method of forming an exemplary memory level in accordance with this invention is described. As will be described below, the first memory level includes a plurality of memory cells that each include a steering element having a first width, and a reversible resistance switching element coupled to the steering element, wherein the reversible resistance switching element has a second width smaller than the first width. Additional memory levels may be fabricated above the first memory level (as described previously with reference to FIGS. 2C-2D).

Figure 4A:
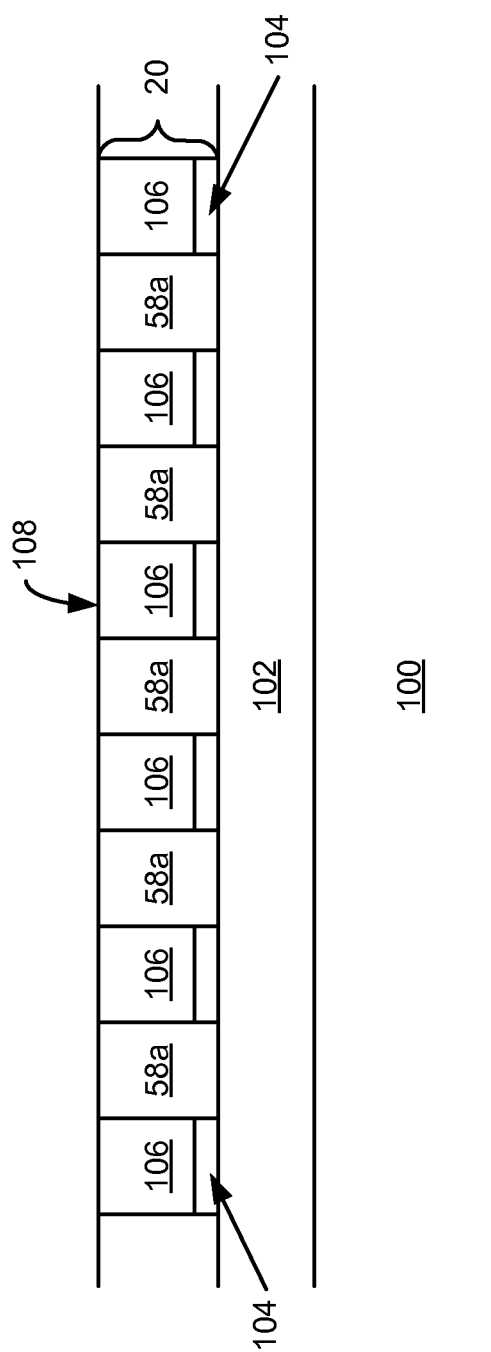
FIGS. 4A-4K illustrate cross-sectional views of a portion of a substrate during an exemplary fabrication of a single memory level in accordance with this invention.

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), physical vapor deposition ("PVD"), etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58*a* is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 108. Planar surface 108 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58*a* is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 108. In such an embodiment, adhesion layer 104 will line the bottom and sidewalls of each opening or void.

Figure 4B:
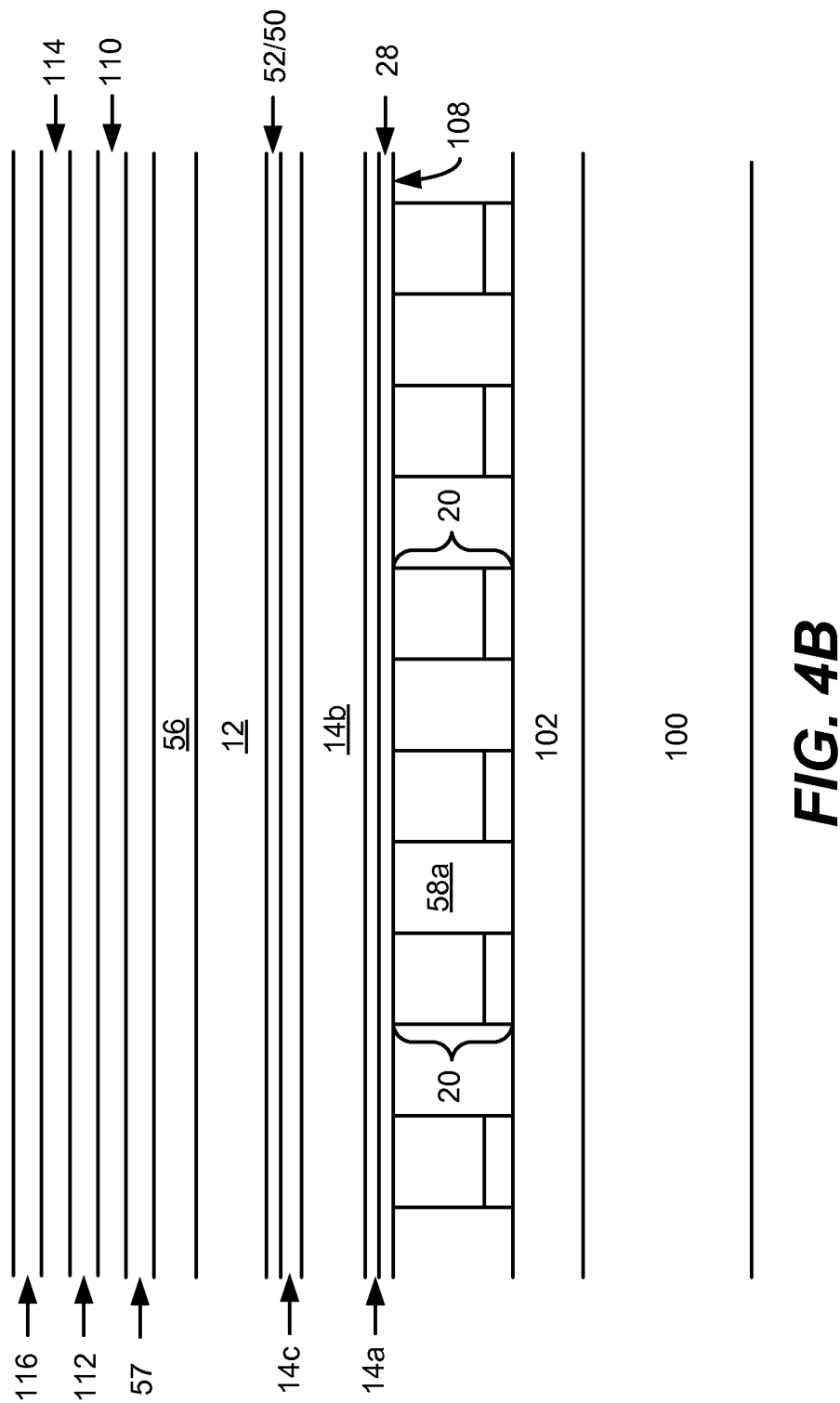

Following planarization, the diode structures of each memory cell are formed. With reference to FIG. 4B, a barrier layer 28 is formed over planarized top surface 108 of substrate 100. Barrier layer 28 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 2 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14*a* is deposited on barrier layer 28. In some embodiments, n+ silicon layer 14*a* is in an amorphous state as deposited. In other embodiments, n+ silicon layer 14*a* is in a polycrystalline state as deposited. CVD or another suitable process may be employed to deposit n+ silicon layer 14*a*. In at least one embodiment, n+ silicon layer 14*a* may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14*a* may be doped in situ, for example, by flowing a donor gas during deposition. Other doping methods may be used (e.g., implantation).

After deposition of n+ silicon layer 14*a*, a lightly doped, intrinsic and/or unintentionally doped silicon layer 14*b* is formed over n+ silicon layer 14*a*. In some embodiments, intrinsic silicon layer 14*b* is in an amorphous state as deposited. In other embodiments, intrinsic silicon layer 14*b* is in a polycrystalline state as deposited. CVD or another suitable deposition method may be employed to deposit intrinsic silicon layer 14*b*. In at least one embodiment, intrinsic silicon layer 14*b* may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14*a* prior to depositing intrinsic silicon layer 14*b* to prevent and/or reduce dopant migration from n+ silicon layer 14*a* into intrinsic silicon layer 14*b* (as described in the '331 Application, previously incorporated).

Heavily doped, p-type silicon is either deposited and doped by ion implantation or is doped in situ during deposition to form a p+ silicon layer 14*c*. For example, a blanket p+ implant may be employed to implant boron a predetermined depth within intrinsic silicon layer 14*b*. Exemplary implantable molecular ions include $BF_2$, $BF_3$, B and the like. In some embodiments, an implant dose of about $1-5\times10^{15}$ ions/cm$^2$ may be employed. Other implant species and/or doses may be used. Further, in some embodiments, a diffusion process may be employed. In at least one embodiment, the resultant p+ silicon layer 14*c* has a thickness of about 100-700 angstroms, although other p+ silicon layer sizes may be used.

Following formation of p+ silicon layer 14*c*, a silicide-forming metal layer 52 is deposited over p+ silicon layer 14*c*. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed at about 540° C. for about one minute to form silicide layer 50, consuming all or a portion of the silicide-forming metal layer 52. Following the RTA step, any residual nitride layer from silicide-forming metal layer 52 may be stripped using a wet chemistry, as described above, and as is known in the art.

Following the RTA step and the nitride strip step, a reversible resistance switching layer 12, such as aC or another carbon-based resistivity switching material, is deposited over silicide layer 50. For simplicity, reversible resistance switching layer 12 will be referred to in the following discussion as "aC layer 12." In some embodiments, CVD, PECVD or another suitable process may be used to deposit aC layer 12. In at least one embodiment, aC layer 12 may have a thickness ranging, for example, from about 50 to about 1000 angstroms, preferably from about 100 to about 400 angstroms. Other layer thicknesses may be used.

A barrier layer 56 is deposited over aC layer 12. Barrier layer 56 may be about 20 to about 500 angstroms, and more preferably about 200 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. Any suitable method may be used to form barrier layer 56. For example, PVD, atomic layer deposition ("ALD"), or the like may be employed.

Following formation of barrier layer 56, a metal layer 57 may be deposited over barrier layer 56. For example, approximately 500 to 1000 angstroms of tungsten may be deposited on barrier layer 56. Any suitable method may be used to form metal layer 57. For example, CVD, PVD, or the like may be employed. As described in more detail below, metal layer 57 may be used as a hard mask layer, and also may be used as a stop during a subsequent chemical mechanical planarization ("CMP") step.

Following formation of metal hard mask layer 57, a dielectric hard mask layer 110 is deposited over metal layer 57. For example, approximately 200 to about 3000 angstroms of silicon dioxide may be deposited on metal hard mask layer 57. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like. Any suitable method may be used to form dielectric hard mask layer 110. For example, PECVD, low pressure chemical vapor deposition ("LPCVD"), or the like may be employed.

After depositing dielectric hard mask layer 110, an additional hard mask layer 112 such as an advanced patterning film ("APF") layer may be formed on dielectric hard mask layer 110, and may comprise, for example, an ashable PECVD amorphous carbon material. For example, approximately 50 to about 5000 angstroms of APF may be deposited on dielectric hard mask layer 110. Other carbon layer materials and/or thicknesses may be employed. Any suitable method may be used to form layer 112. For example, PECVD, spin-on techniques, or the like may be used. For simplicity, layer 112 will be referred to as "APF hard mask layer 112."

Layers 57, 110 and 112 serve as a hard mask during the silicon etch. A hard mask is an etched layer which serves to pattern the etch of an underlying layer. In at least one embodiment, the combined thickness of hard mask layers 57, 110 and 112 may be, for example, from about 1000 to about 5000 angstroms. Other layer thicknesses may be used.

Following deposition of second hard mask layer 112, a anti-reflection coating, such as a dielectric anti-reflective coating ("DARC") layer 114, may be formed on top of APF hard mask layer 112. DARC layer 114 may comprise any suitable material, such as silicon oxynitride, for improvement of lithographic patterning of photoresist. In some embodiments, DARC layer 114 has a thickness of about 100 to about 600 angstroms, preferably about 200 to about 500 angstroms. Other DARC layer materials and/or thicknesses may be used. Any suitable method may be used to form DARC layer 114. For example, PECVD or the like may be used.

Photoresist layer 116 is formed on DARC layer 114. Photoresist layer 116 may be about 200 to 2000 angstroms of any suitable positive or negative resist material, such as polymethylmethacrylate ("PMMA"), or other photosensitive organic polymers known in the art. Other photoresist layer materials and/or thicknesses may be employed. Any suitable method may be used to form photoresist layer 116. For example, a spin-on technique or the like may be used.

Figure 4C:
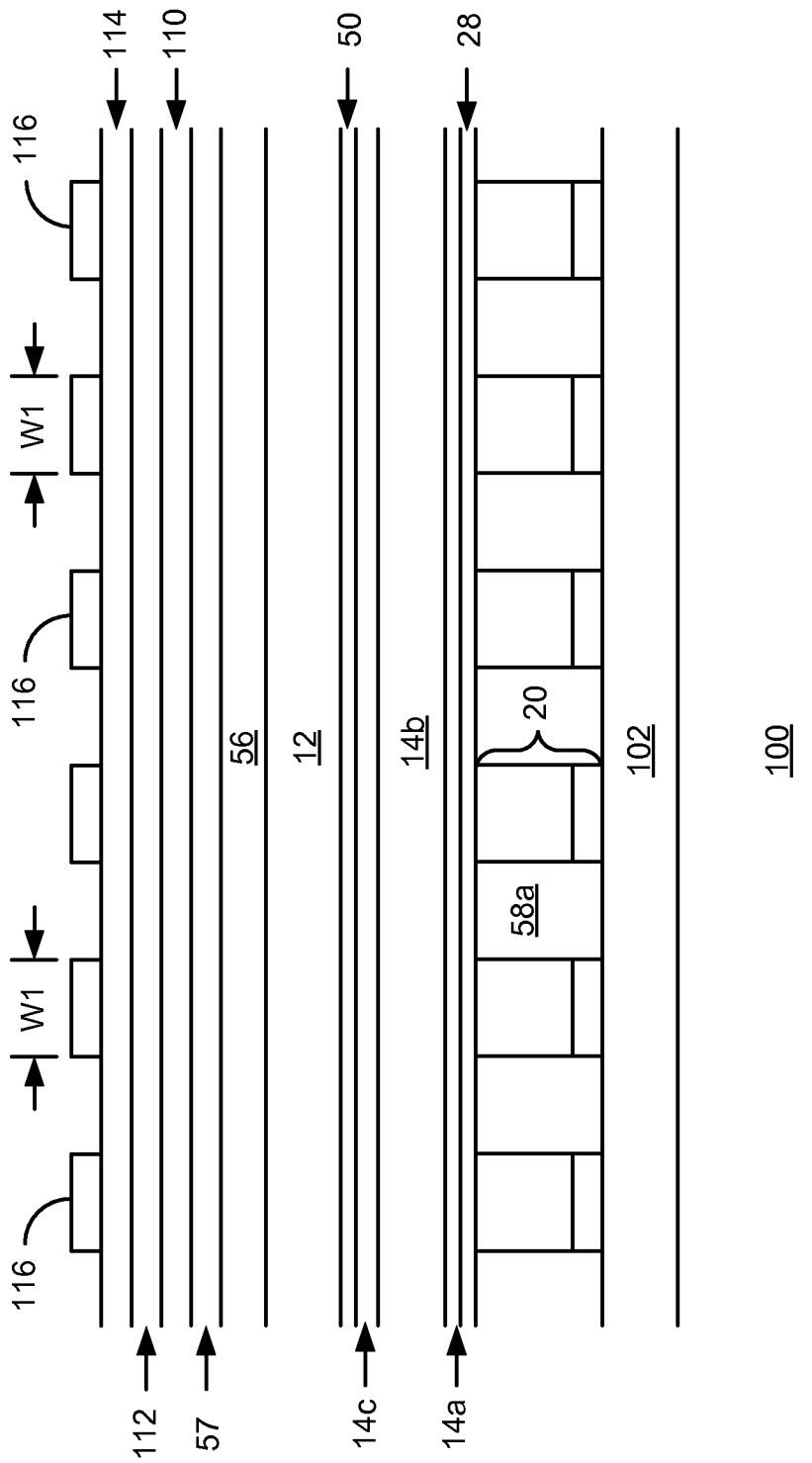

Referring now to FIG. 4C, photoresist layer 116 is next patterned and developed to width W1. For example, photoresist layer 116 may be patterned and etched using conventional lithography techniques. As shown in FIG. 4C, photoresist layer 116 is patterned and developed to form substantially parallel, substantially coplanar patterned photoresist regions 116 having width W1. In some embodiments width W1 is about 10 nm to about 100 nm, and more preferably about 10 to about 45 nm. In at least one exemplary embodiment, W1 is about 43 nm.

Figure 4D:
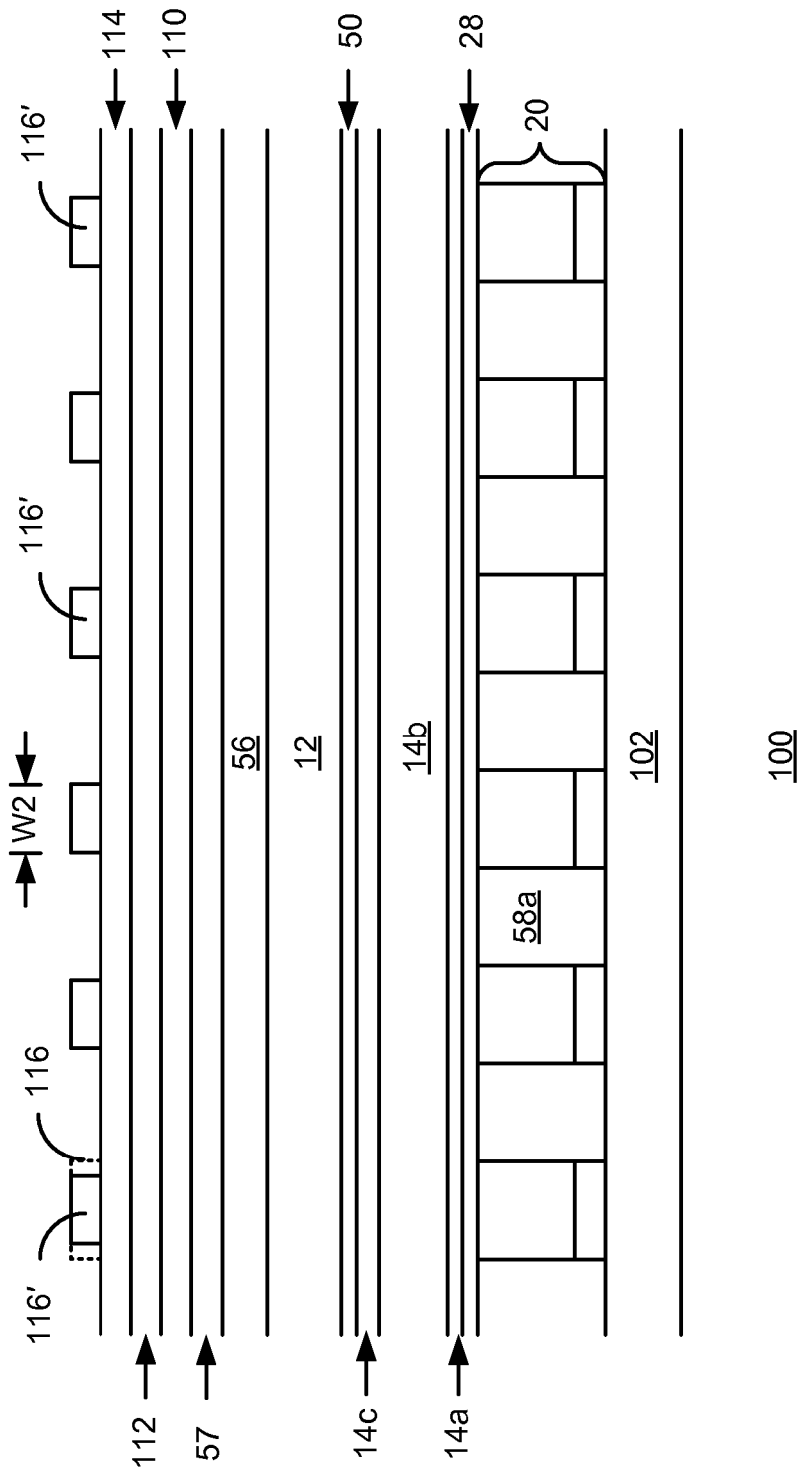

Patterned photoresist regions 116 are shrunken to form shrunken photoresist regions 116' having a width W2, as illustrated in FIG. 4D. For example, any suitable photoresist shrink technique may be used, such as one based on wet chemistry, dry chemistry, or energetic plasma species. For instance, patterned photoresist regions 116 may be exposed to an energetic plasma species of O, H, and/or $NH_2$ may be formed using appropriate precursor gases (e.g., $O_2$, $NH_3$, $H_2$, $N_2O$, CO, $CO_2$, etc.) to shrink each region 116. Persons of ordinary skill in the art will understand that techniques other than photoresist shrink techniques may be used to form shrunken photoresist regions 116' having width W2. For example, emerging lithography tools that can form features well below 30 nm may be used to directly form shrunken photoresist regions 116' having width W2.

Figure 4E:
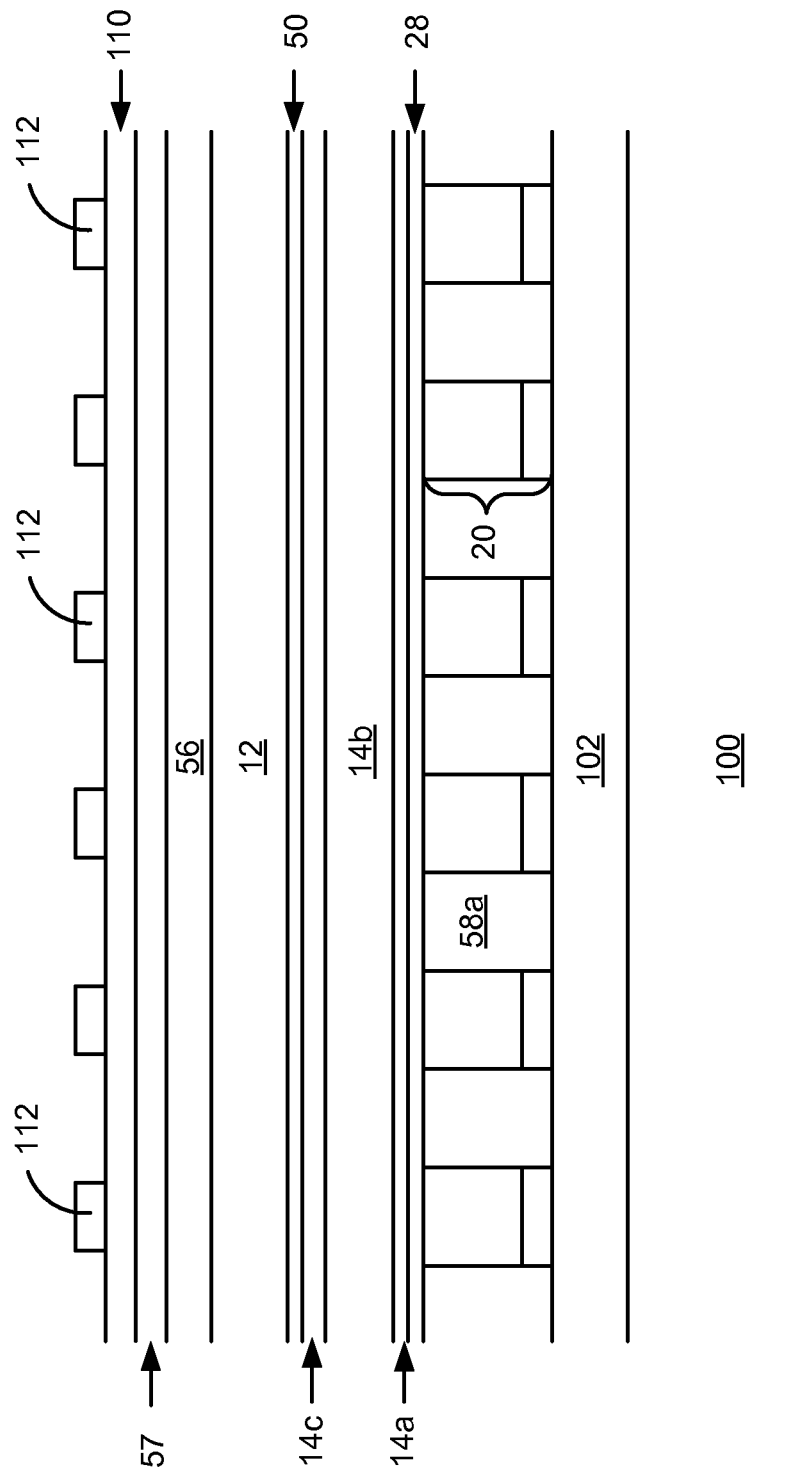

Shrunken photoresist regions 116' are used to pattern and etch DARC layer 114 and second hard mask layer 112 using conventional etch techniques, such as wet or dry etch processing. After patterning and etching, shrunken photoresist regions 116' and etched DARC layer 114 are removed, leaving patterned and etched APF hard mask layer regions 112, as shown in FIG. 4E.

Figure 4F:
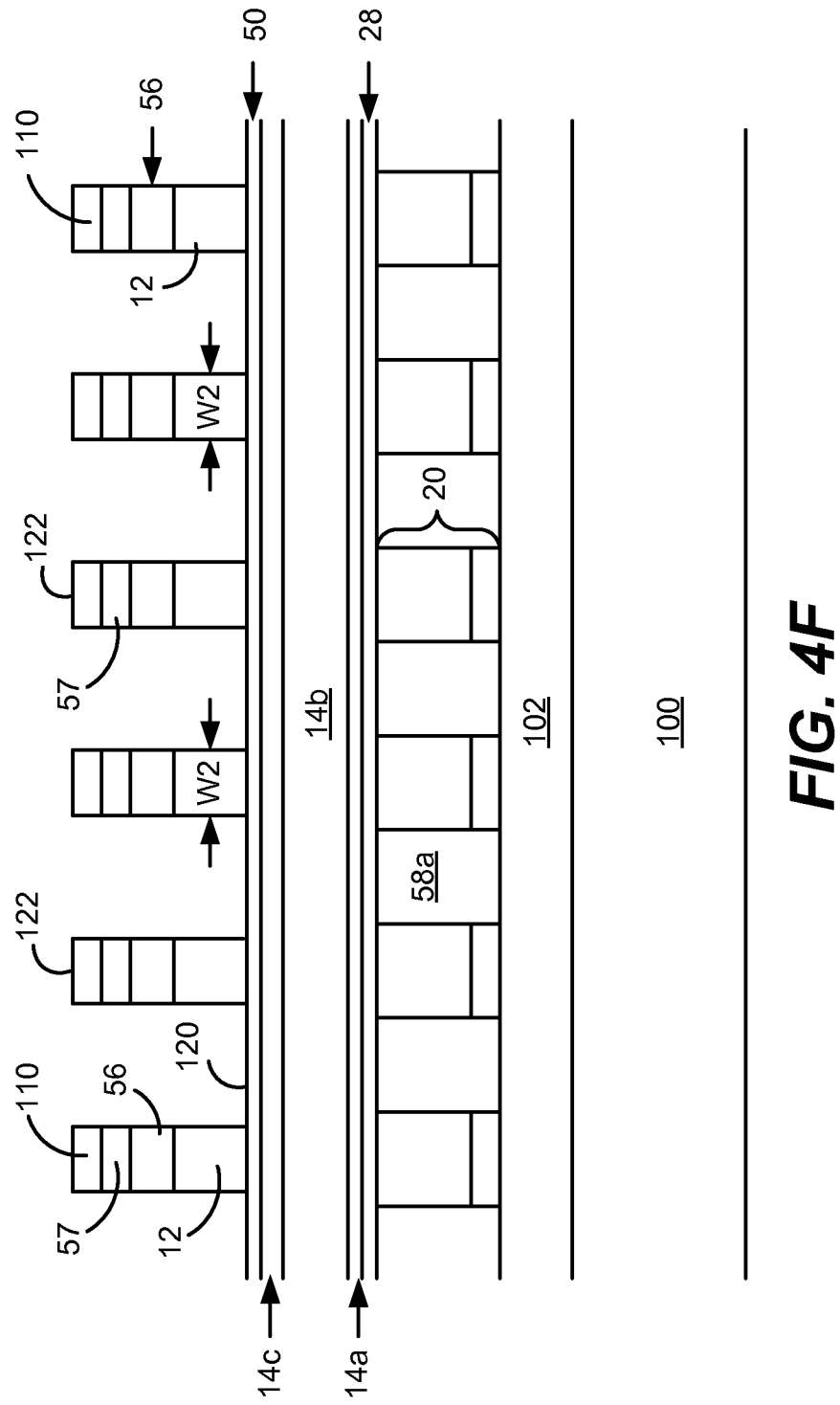

APF hard mask regions 112 are then used as a hardmask to pattern and etch dielectric hard mask layer 110, metal hard mask layer 57, barrier layer 56 and aC layer 12 to top surface 120 of silicide-forming metal layer 52 to form substantially parallel pillars 122 having a width W2, as illustrated in FIG. 4F. Following the etching step, APF hard mask regions 112 are removed, resulting in the structure illustrated in FIG. 4F. In some embodiments, dielectric hard mask layer 110, metal hard mask layer 57, barrier layer 56 and aC layer 12 may be etched using wet or dry etch processing, or other similar etching techniques. In some embodiments, pillars 122 have a width W2 of about 5 nm to about 50 nm, and preferably about 5 nm to about 20 nm. In at least one exemplary embodiment, pillars 122 have a width W2 of about 19 nm.

Figure 4G:
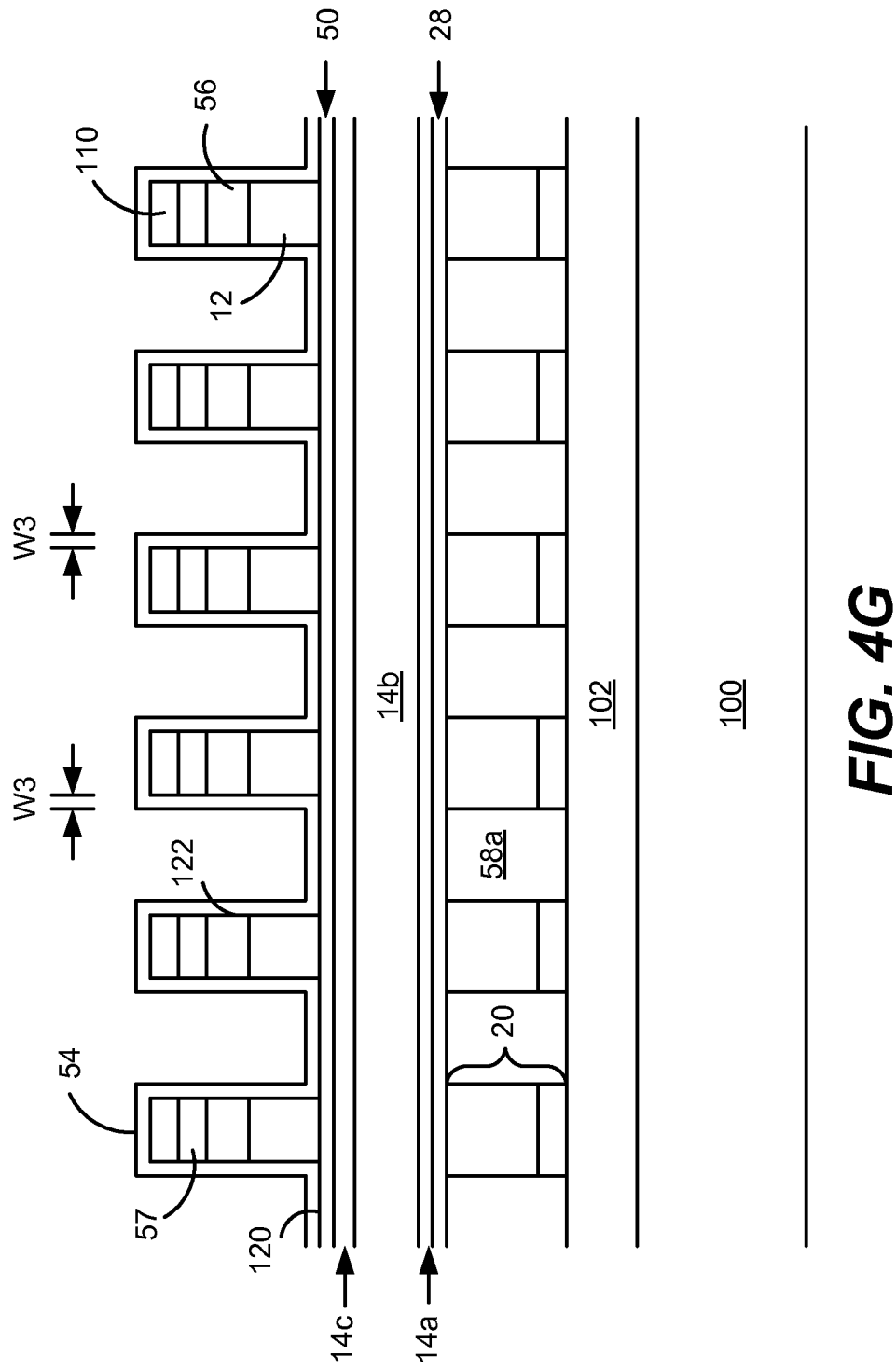

As illustrated in FIG. 4G, a conformal liner 54 is deposited on top surface 120 and pillars 122. Liner 54 may be formed using a dielectric material, such as silicon nitride, silicon oxynitride, low K dielectrics, etc. Exemplary low K dielectrics include carbon doped oxides, silicon carbon layers, or the like. Liner 54 has a vertical sidewall width W3. In some embodiments, liner 54 has a vertical sidewall width W3 of about 2.5 nm to about 25 nm, and more preferably about 2.5 nm to about 12.5 nm. In at least one exemplary embodiment, W3 is about 12 nm. Any suitable method may be used to form liner 54. For example, PECVD, ALD, or the like may be employed.

Figure 4H:
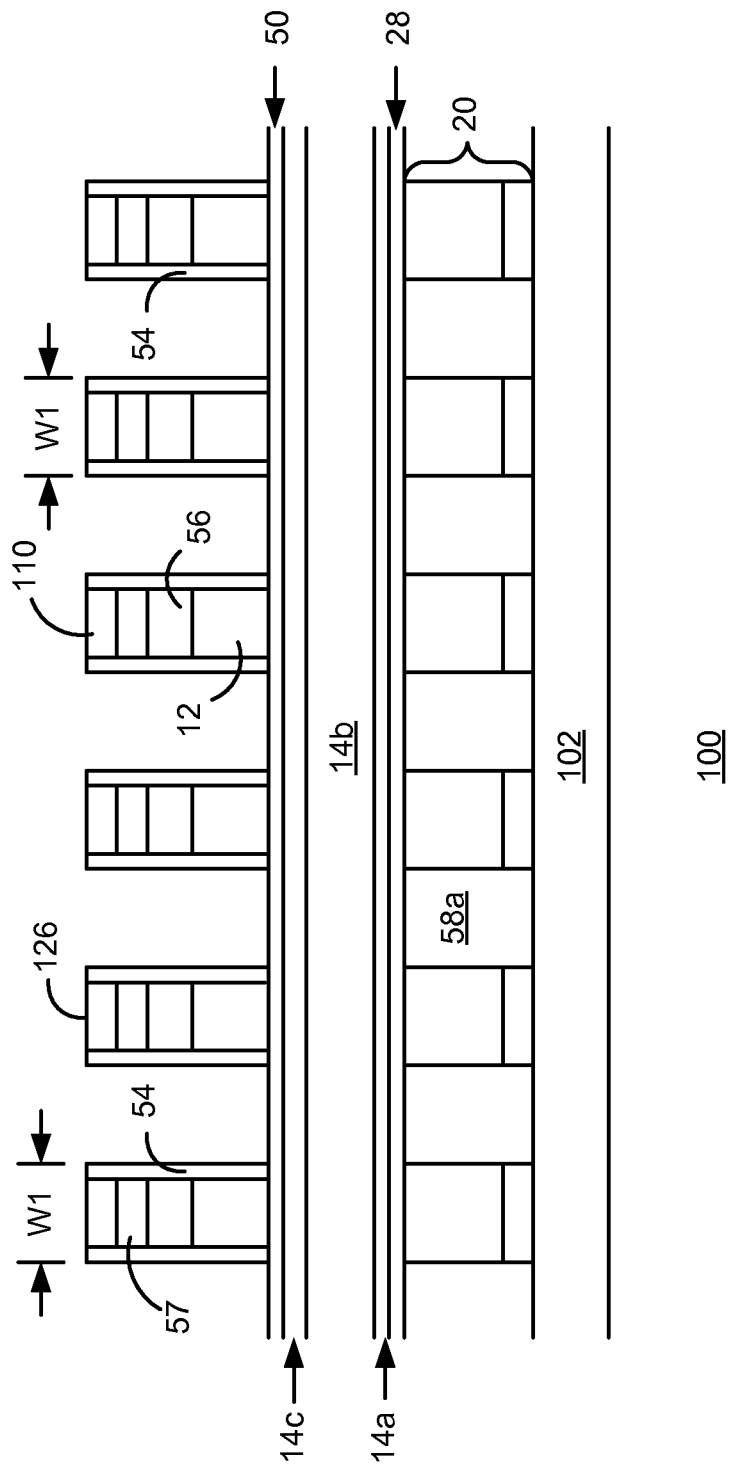

An anisotropic etch is used to remove lateral portions of liner 54, leaving only sidewall portions of liner 54, to form substantially parallel pillars 126 having a width W1 (e.g., the desired width for the diode steering elements described below), as illustrated in FIG. 4H. For example, a sputter etch or other suitable process may be used to anisotropically etch liner 124.

Figure 4I:
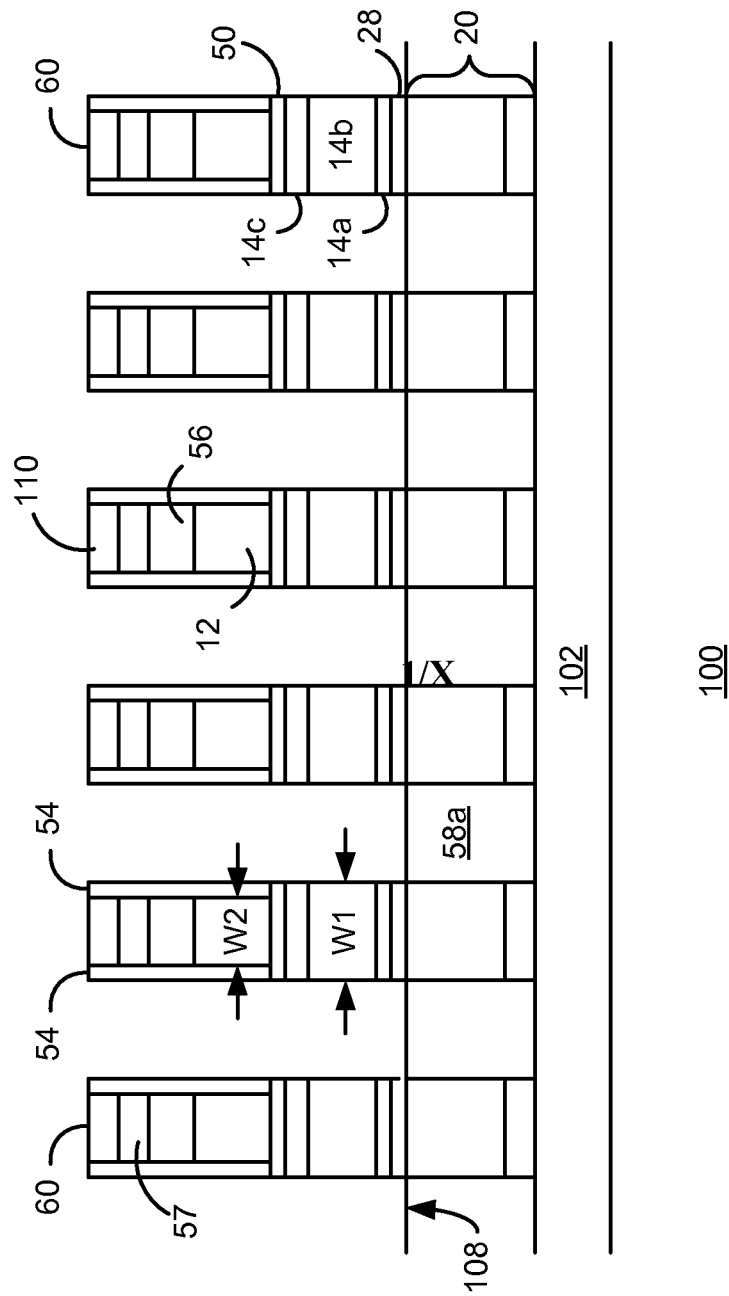

As shown in FIG. 4I, pillars 126 (with dielectric hard mask layer 110 still present) are used as a hard mask to pattern and etch silicide layer 50, and diode layers 14a-14c to form pillars 60 having a width W1. In some embodiments, the pillars 60 may be formed during the same etch step used to remove lateral portions of liner 54, whereas in other embodiments separate etch steps may be used. In either case, following etching of the lateral portions of liner 54, silicide layer 50 is etched. The etch continues, etching diode regions 14c, 14b and 14a, and barrier layer 28. Each pillar 60 includes aC layer 12 having a width W2, and a p-i-n, downward-pointing diode 14 having a width W1, with W2 less than W1. Persons of ordinary skill in the art will understand that upward-pointing p-i-n diodes may be similarly formed.

Figure 4J:
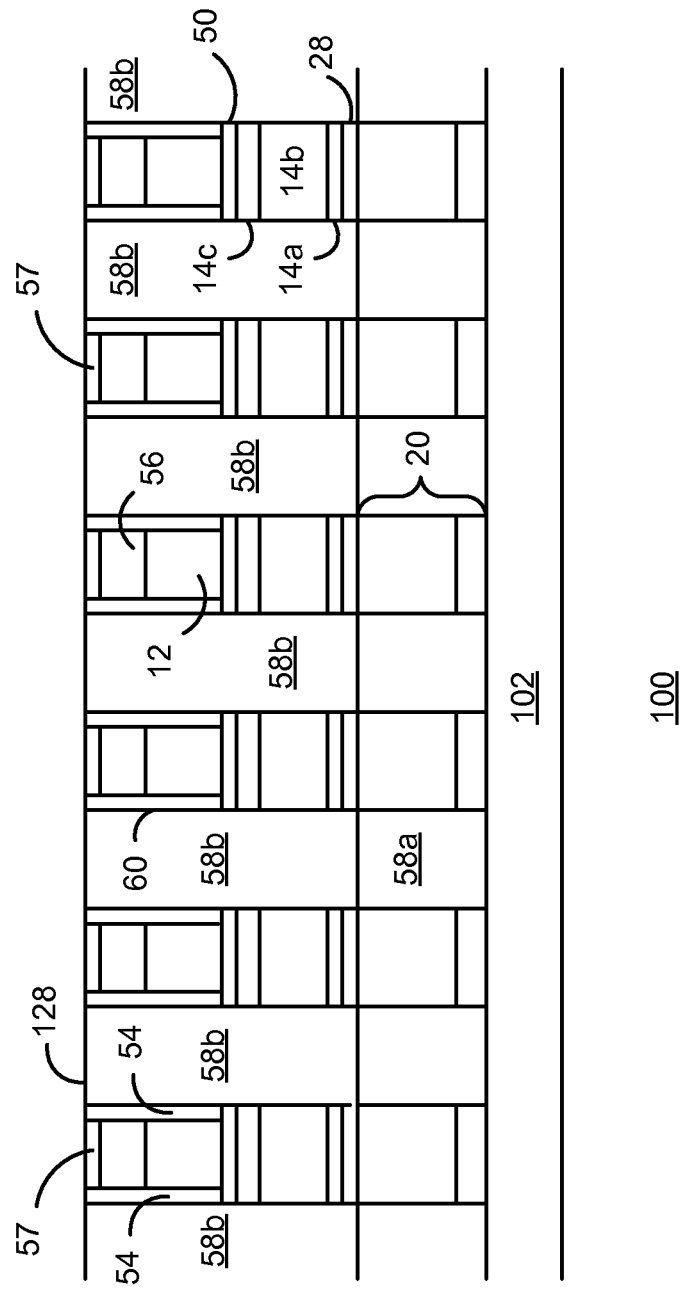

After pillars 60 have been formed, a dielectric layer 58b is deposited over pillars 60 to gapfill between pillars 60. For example, approximately 2000-7000 angstroms of silicon dioxide may be deposited and planarized using CMP or an etchback process to remove excess dielectric layer material 58b and dielectric hard mask layer 110 to form a planar surface 128, resulting in the structure illustrated in FIG. 4J. During the planarization process, metal layer 57 may be used as a CMP stop. Planar surface 128 includes exposed top surfaces of pillars 60 separated by dielectric material 58b (as shown). Other dielectric materials may be used for the dielectric layer 58b such as silicon nitride, silicon oxynitride, low K dielectrics, etc., and/or other dielectric layer thicknesses may be used. Exemplary low K dielectrics include carbon doped oxides, silicon carbon layers, or the like.

Figure 4K:
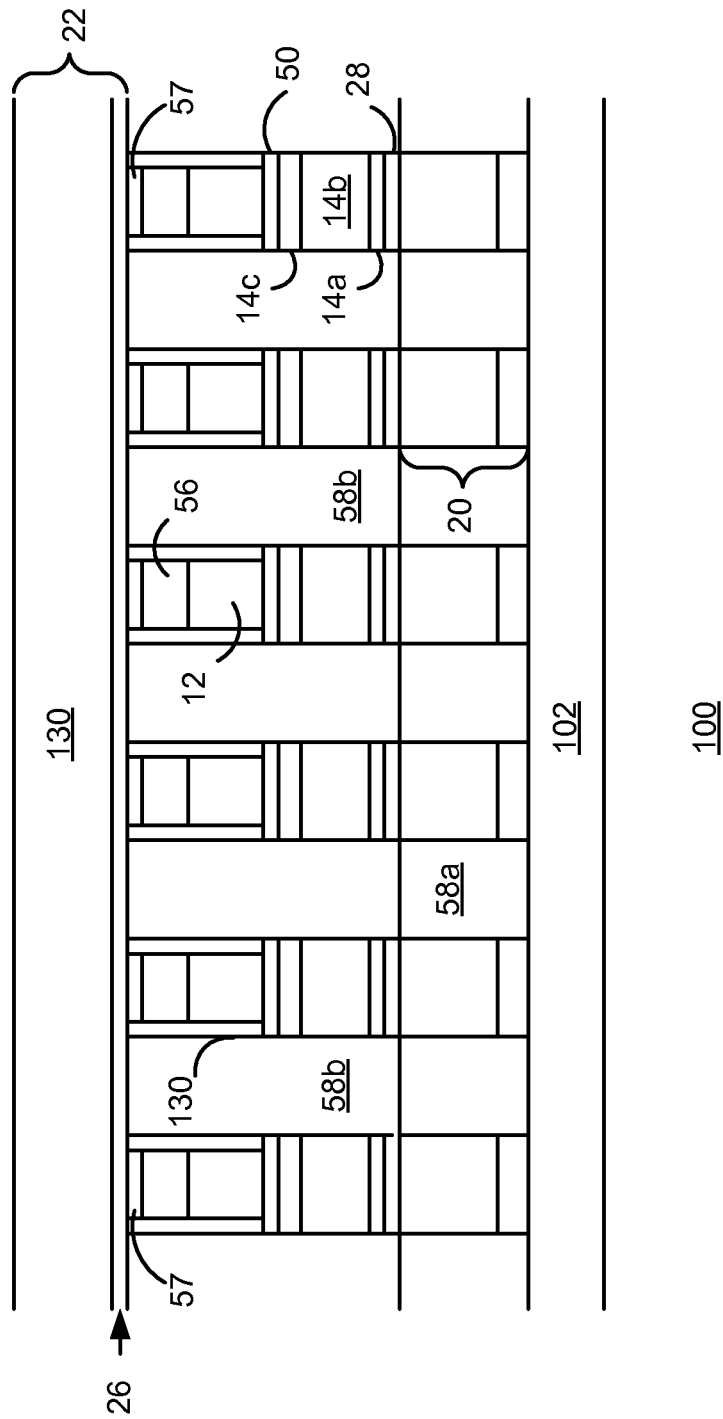

With reference to FIG. 4K, following planarization of dielectric layer 58b, a second conductor 22 is formed above pillars 60 in a manner similar to the formation of first conductors 20. For example, in some embodiments, one or more barrier layers and/or adhesion layers 26 may be deposited over metal hard mask layers 57 prior to deposition of a conductive layer 130 used to form the second conductor 22.

Conductive layer 130 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Barrier layers and/or adhesion layers 26 may include titanium nitride or another suitable layer such as tantalum nitride, tungsten nitride, combinations of one or more layers, or any other suitable material(s). In at least one embodiment, conductive layer 130 may comprise about 200 to about 2500 angstroms of tungsten, and barrier/adhesion layer 26 may comprise about 20 to about 500 angstroms of TiN. Other conductive layer and barrier layer materials and/or thicknesses may be used.

The deposited conductive layer 130 and barrier and/or adhesion layer 26, may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 130 (and/or a conductive seed, conductive fill and/or barrier layer if needed). Adhesion layer 26 and conductive layer 130 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 52 and p+ region 14c react may serve as "crystallization templates" or "seeds" during annealing for underlying deposited semiconductor material that forms diodes 14 (e.g., changing any amorphous semiconductor material to polycrystalline semiconductor material and/or improving overall crystalline properties of diodes 14). Lower resistivity diode material thereby is provided.

Figure 5A:
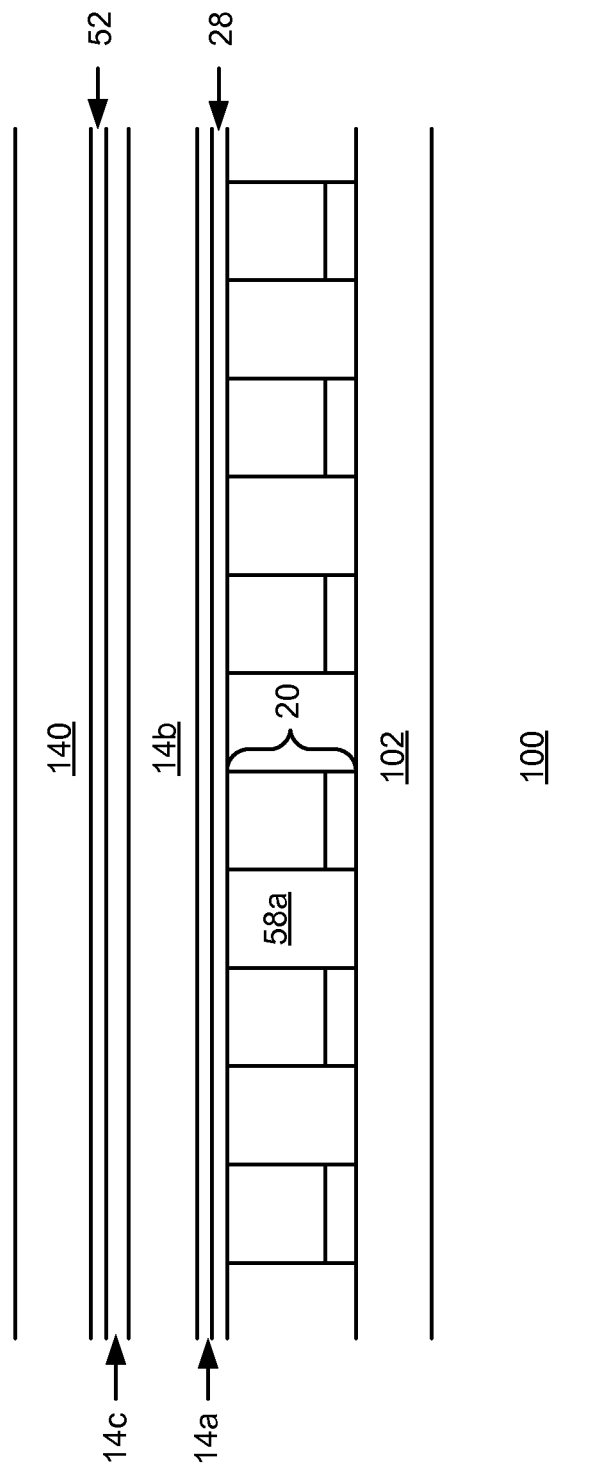
FIGS. 5A-5G illustrate cross-sectional views of a portion of a substrate during an alternative exemplary fabrication of a single memory level in accordance with this invention.

Referring now to FIG. 5A-G, an alternative exemplary fabrication process of an exemplary memory level in accordance with this invention is described. With reference to FIG. 5A, substrate 100 is shown as having already undergone several processing steps, including formation of isolation layer 102, first conductors 20, dielectric backfill 58a, barrier layer 28, diode layers 14a-14c, and silicide-forming metal layer 52, as described above in connection with FIGS. 4A-4B. Next, a layer 140 is deposited over silicide-forming metal layer 52. As will be described below, layer 140 will be used in a Damascene process to form voids that will be filled with reversible resistance switching material. In this regard, layer 140 is sometimes called a "sacrificial layer." In at least one embodiment, sacrificial layer 140 includes approximately 200 to 1500 angstroms, preferably 200 to 800 angstroms of germanium, although other sacrificial materials may be used.

Figure 5B:
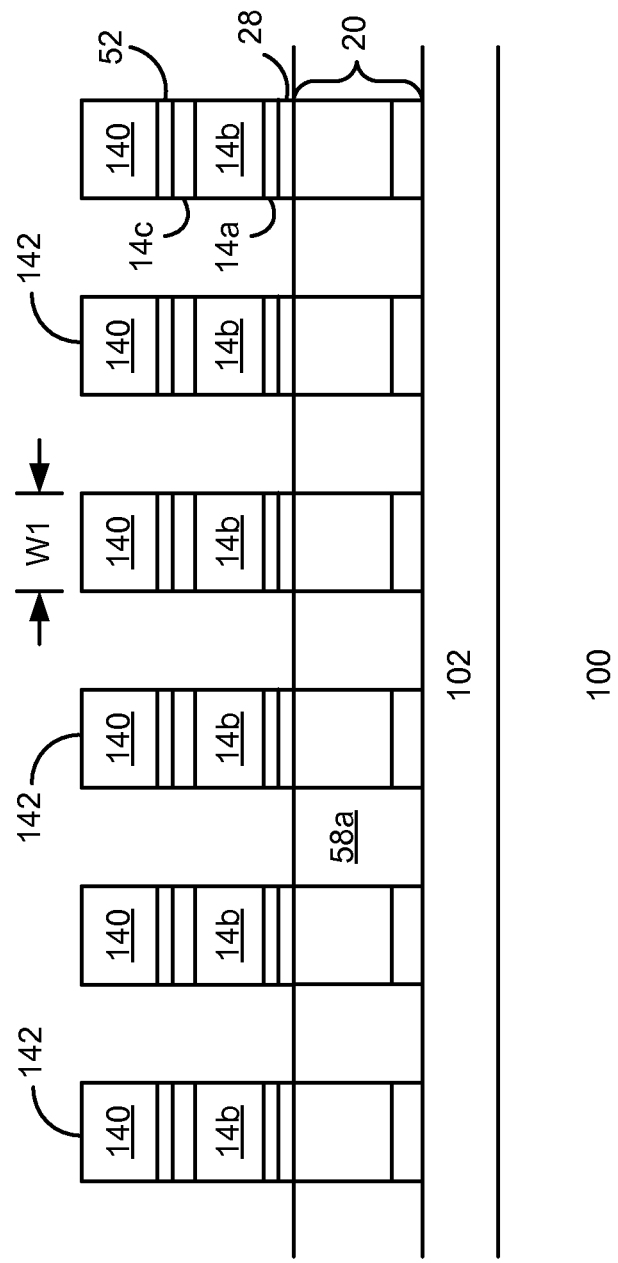
Figure 5C:
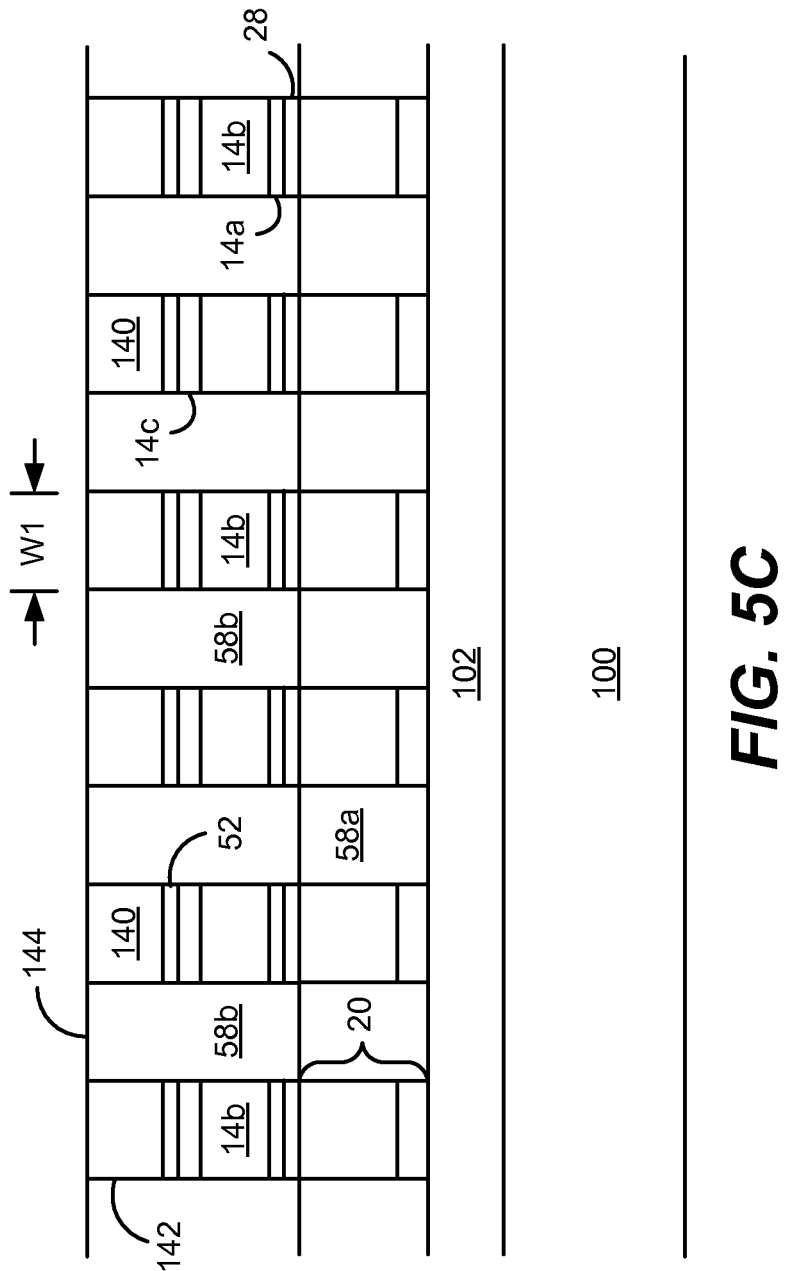

As shown in FIG. 5B, sacrificial layer 140, silicide-forming metal layer 52, diode layers 14a-14c and barrier layer 28 are patterned and etched to form pillars 142 having a width W1. In at least one exemplary embodiment, W1 is between about 10 to about 100 nm. In other exemplary embodiments, W1 is between about 10 nm and about 45 nm. In at least one exemplary embodiment, W1 is about 43 nm.

After pillars 142 have been formed, a dielectric layer 58b is deposited over pillars 142 to fill the voids between pillars 142. For example, approximately 2000-7000 angstroms of silicon dioxide may be deposited and planarized using chemical mechanical polishing or an etchback process to form a planar surface 144, resulting in the structure illustrated in FIG. 5C. Planar surface 144 includes exposed top surfaces of pillars 142 separated by dielectric material 58b (as shown). Other dielectric materials such as silicon nitride, silicon oxynitride, low K dielectrics, etc., and/or other dielectric layer thicknesses may be used.

Figure 5D:
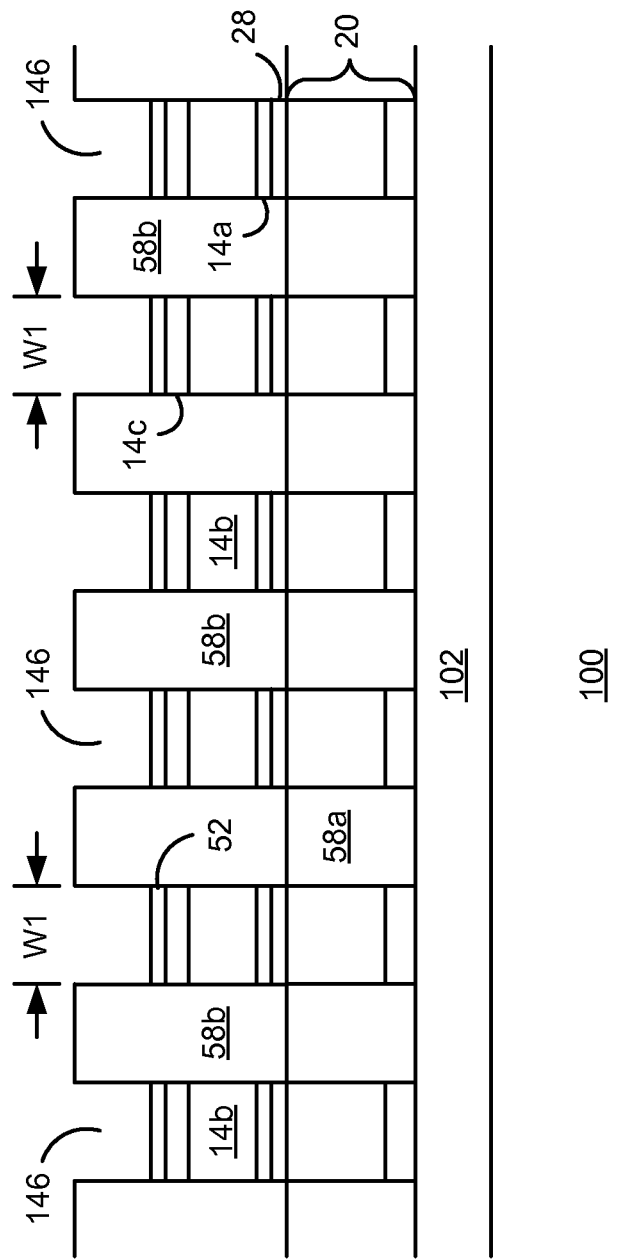

As shown in FIG. 5D, the patterned portions of sacrificial layer 140 are removed, such as by a selective wet or dry etch process, to form voids 146 having width W1. For example, germanium may be selectively etched relative to silicon dioxide using any aqueous solution.

Figure 5E:
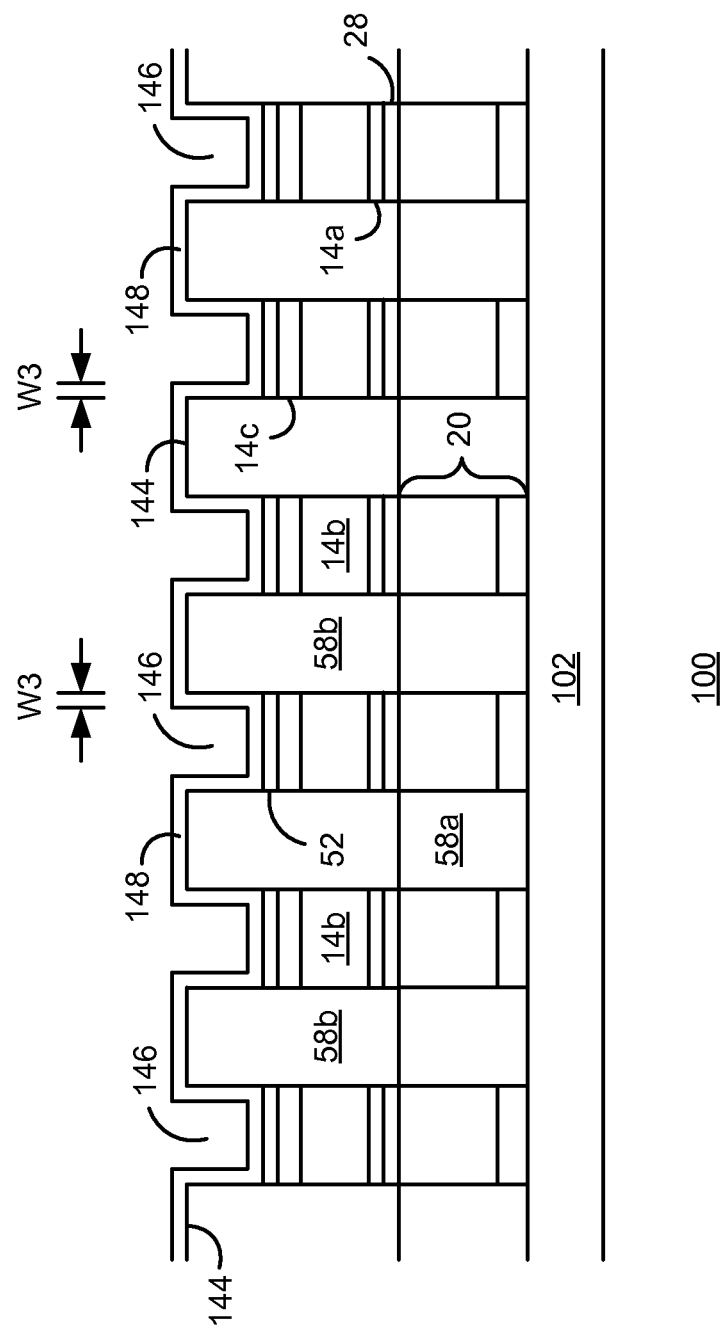

As shown in FIG. 5E, a conformal liner 148 is deposited on surfaces 144 and on sidewall and bottom surfaces of voids 146. Liner 148 may be formed using a dielectric material, such as silicon nitride, silicon oxynitride, low K dielectrics, etc. Liner 148 has a vertical sidewall width W3. In some embodiments, liner 148 has a vertical sidewall width W3 of between about 2.5 nm to about 25 nm, and more preferably between about 2.5 nm to about 12.5 nm. In at least one exemplary embodiment, W3 is about 12 nm. Any suitable method may be used to form liner 148. For example, ALD, PECVD, or the like may be employed. Following formation of conformal liner 148, an anisotropic etch is used to remove lateral portions of conformal liner 148, leaving only sidewall portions of conformal liner 148. For example, a sputter etch or other suitable process may be used to anisotropically etch conformal liner 148.

Figure 5F:
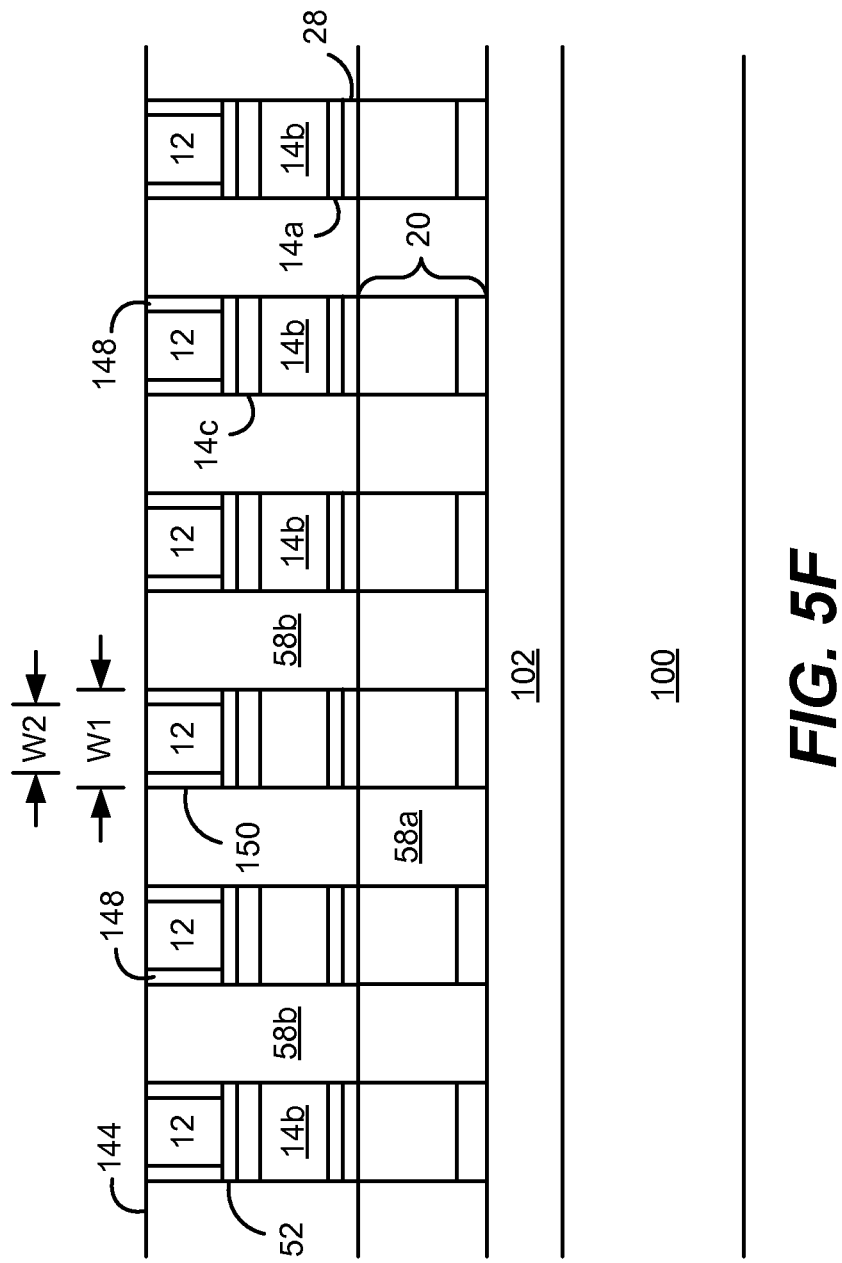

As shown in FIG. 5F, aC layer 12 is deposited over the conformal liner 148 into voids 146 between sidewall portions of liner 148 and planarized to remove the aC material and any remaining liner material from surfaces 144 and to form isolated pillars 150 having a width W1. In some embodiments, CVD, PECVD or another suitable process may be used to deposit aC layer 12. In at least one embodiment, aC layer 12 may have a thickness, for example, from about 50 to about 1000 angstroms, preferably from about 100 to about 400 angstroms. Other layer thicknesses may be used.

Each pillar 150 includes aC layer 12 having a width W2, and a p-i-n, downward-pointing diode 14 having a width W1, with W2 less than W1. Persons of ordinary skill in the art will understand that upward-pointing p-i-n diodes may be similarly formed.

Figure 5G:
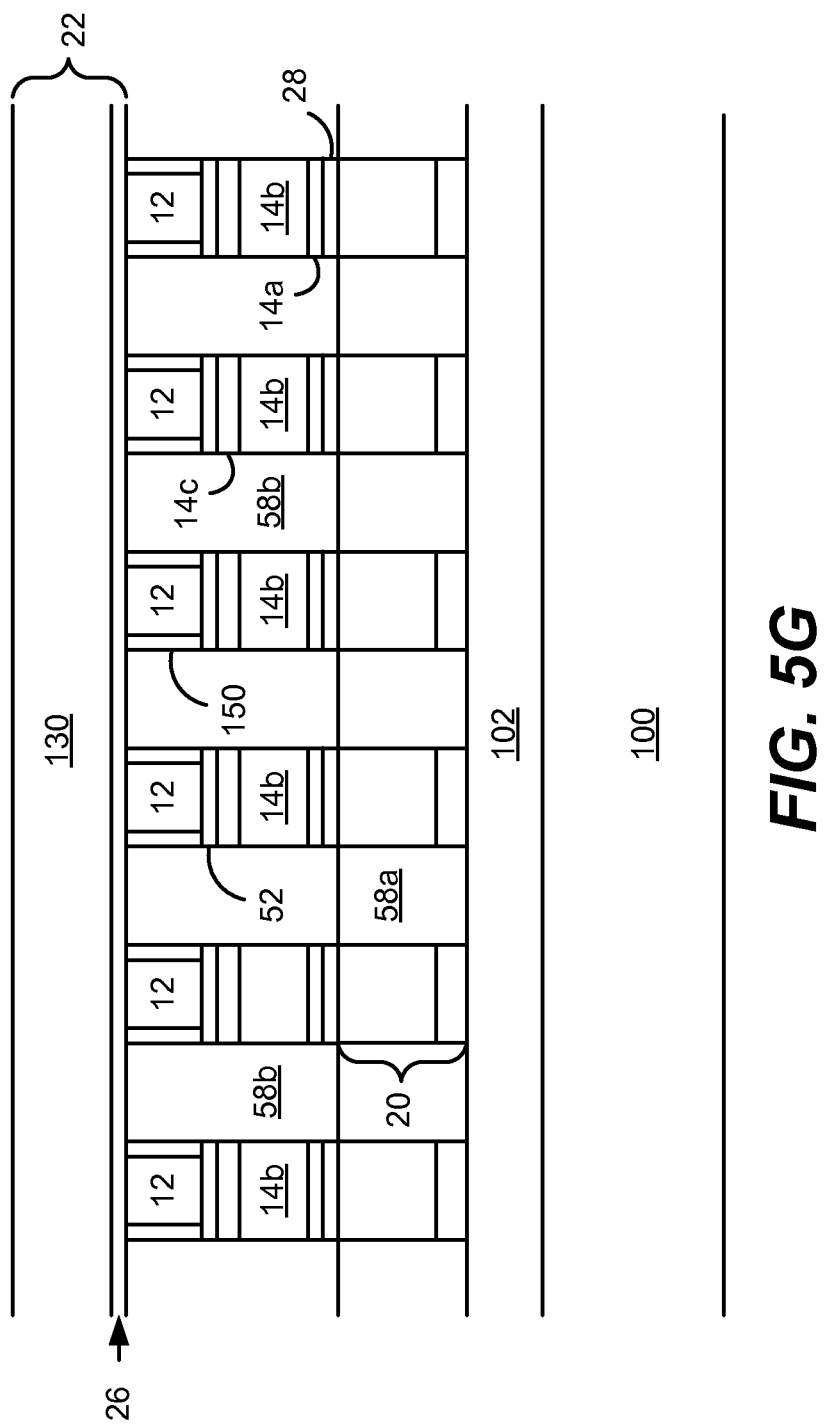

With reference to FIG. 5G, a second conductor 22 is formed above pillars 150 in a manner similar to the formation of first conductors 20. For example, in some embodiments, one or more barrier layers and/or adhesion layers 26 may be deposited over pillars 150 prior to deposition of a conductive layer 130 used to form the second conductor 22, as described above in connection with FIG. 4K. The layers 26 and 130 may be patterned and etched to form second conductors 22. In at least one embodiment, second conductors 22 are substantially parallel, substantially coplanar conductors that extend in a different direction than first conductors 20. In some embodiments, a damascene process may be used to form the second conductors 22 (as previously described).

Following formation of second conductors 22, the resultant structure may be annealed to crystallize the deposited semiconductor material of diodes 14 (and/or to form silicide regions by reaction of the silicide-forming metal layer 52 with p+ region 14c). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 52 and p+ region 14c react may serve as "crystallization templates" or "seeds" during annealing for underlying deposited semiconductor material that forms diodes 14 (e.g., changing any amorphous semiconductor material to polycrystalline semiconductor material and/or improving overall crystalline properties of diodes 14). Lower resistivity diode material thereby is provided.

Figure 6A:
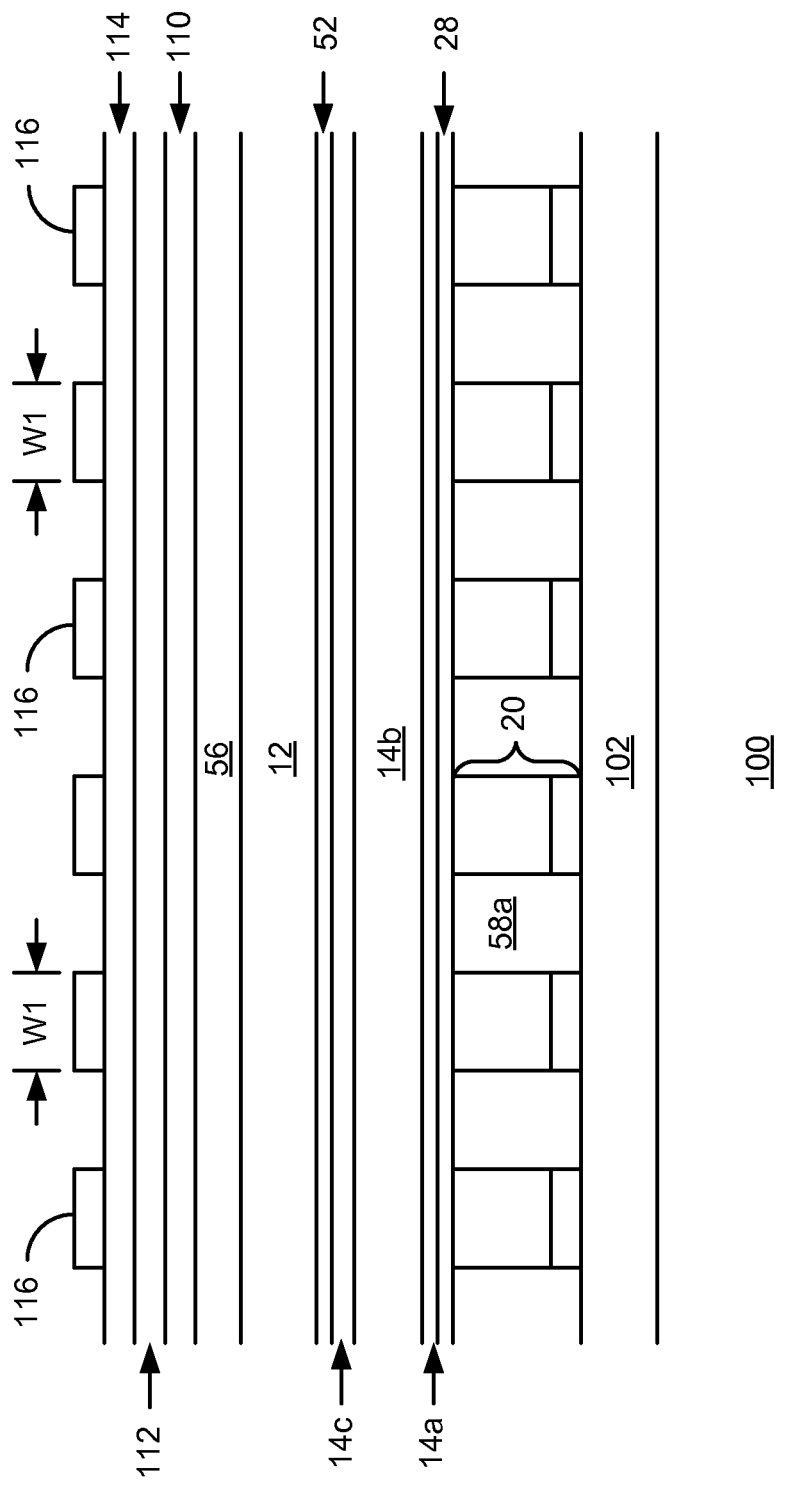
FIGS. 6A-6H illustrate cross-sectional views of a portion of a substrate during another alternative exemplary fabrication of a single memory level in accordance with this invention.

Referring now to FIG. 6A-H, another alternative exemplary fabrication process of an exemplary memory level in accordance with this invention is described. With reference to FIG. 6A, substrate 100 is shown as having already undergone several processing steps, including formation of isolation layer 102, first conductors 20, dielectric backfill 58a, barrier layer 28, diode layers 14a-14c, silicide-forming metal layer 52, aC layer 12, barrier layer 56, a first hard mask layer (e.g., oxide layer 110), a second hard mask layer (e.g., APF layer 112), DARC layer 114, and patterned and developed photoresist regions 116, as described above in connection with FIGS. 4A-4C.

Figure 6B:
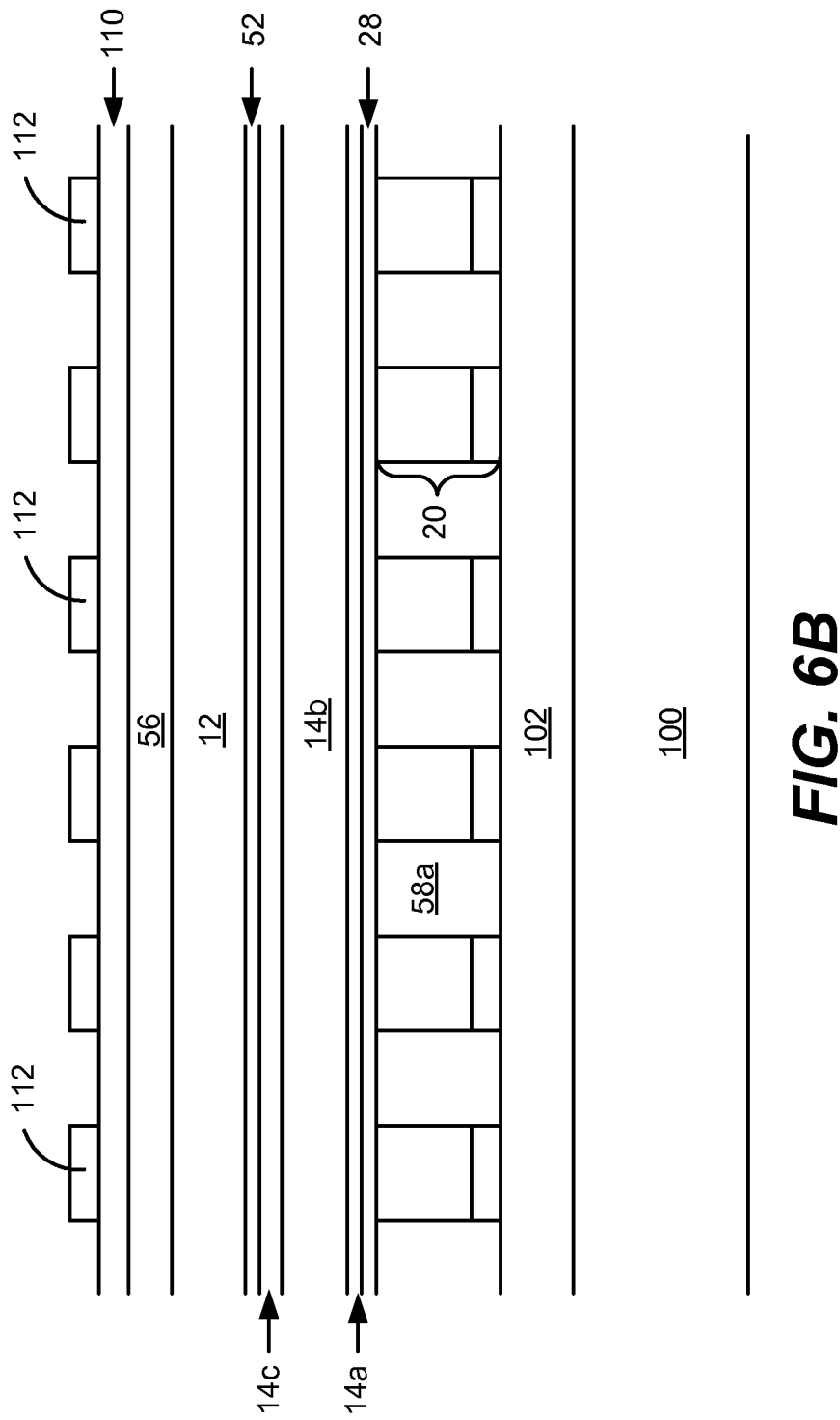

Photoresist regions 116 are used to pattern and etch DARC layer 114 and APF layer 112 using conventional etch techniques, such as wet or dry etch processing. After patterning and etching, photoresist regions 116 and etched DARC layer 114 are removed, leaving patterned and etched APF regions 112, as shown in FIG. 6B.

Figure 6C:
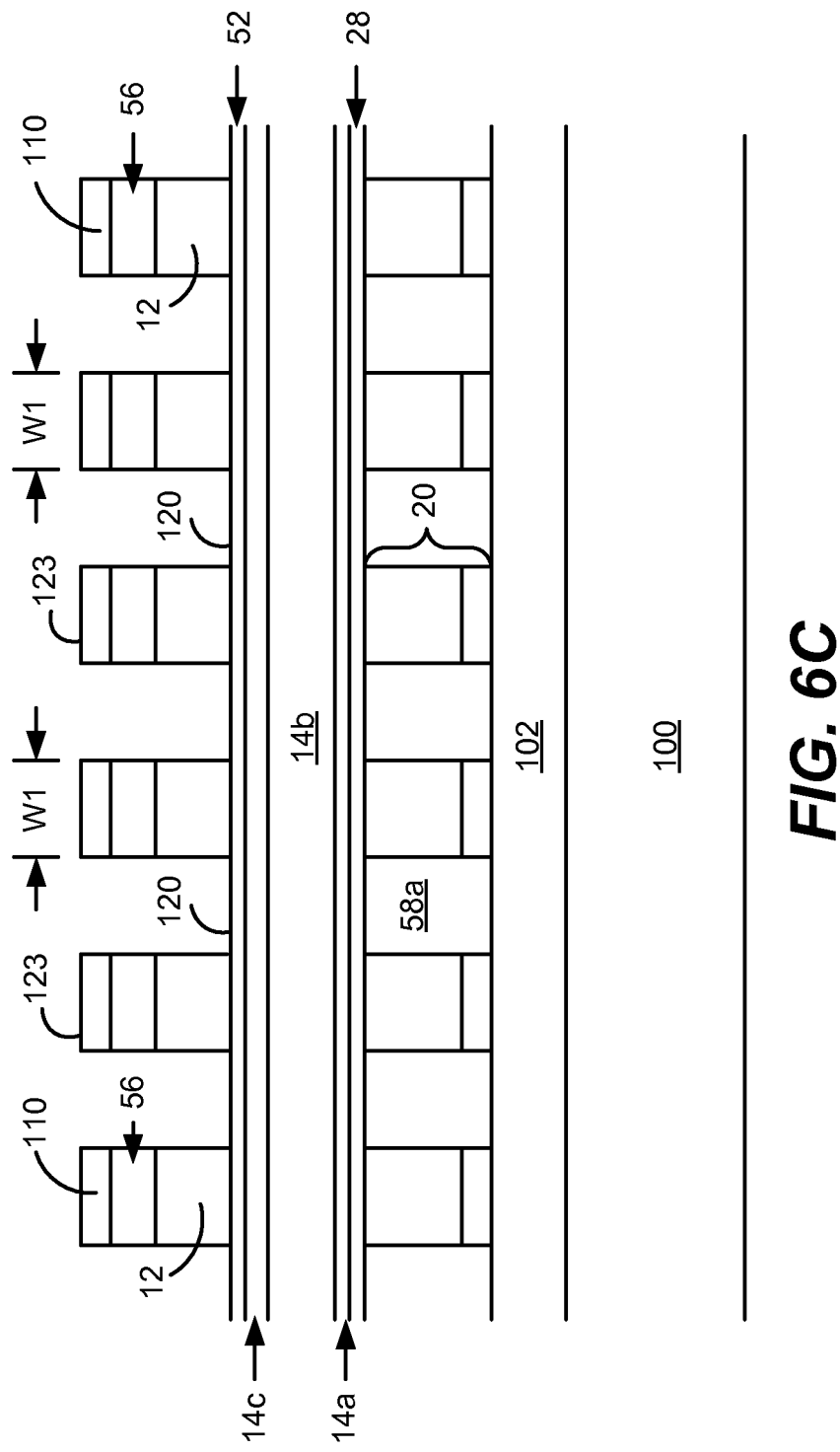

APF regions 112 are then used as a hardmask to pattern and etch oxide layer 110, barrier layer 56 and aC layer 12 to top surface 120 of silicide-forming metal layer 52 to form substantially parallel pillars 123 having a width W1, as illustrated in FIG. 6C. For example, oxide layer 110, barrier layer 56 and aC layer 12 may be etched using wet or dry etch processing, or other similar etching techniques. In various exemplary embodiments, pillars 122 have a width W1 between about 10 nm and about 100 nm. In other exemplary embodiments, pillars 122 have a width W1 between about 10 nm and about 45 nm. In at least one exemplary embodiment, pillars 122 have a width W1 of about 43 nm. Persons of ordinary skill in the art will understand that other W1 values may be used. Following the etching step, APF regions 112 are removed.

Figure 6D:
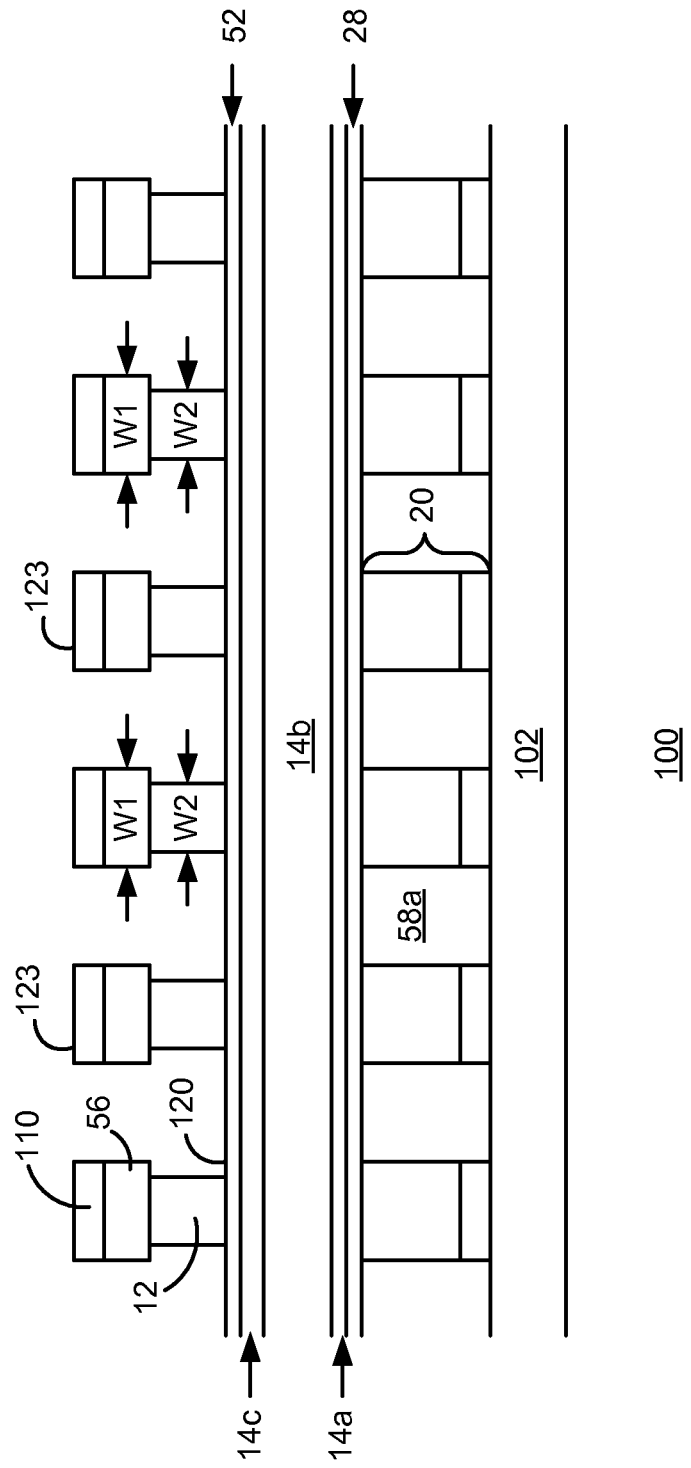

As shown in FIG. 6D, aC layer 12 is narrowed using a carbon layer shrink technique to form aC regions 12 having a width W2. In some embodiments, aC regions 12 have a width W2 between about 5 nm and about 50 nm. In other exemplary embodiments, aC regions 12 have a width W2 between about 5 nm and about 20 nm. In at least one exemplary embodiment, aC regions 12 have a width W2 of about 19 nm. Persons of ordinary skill in the art will understand that other W2 values may be used.

In some embodiments, carbon layer shrink techniques are employed that selectively reduce the width of only aC layer 12 and preferably do not affect other layers of pillar 123. Shrinking the width of aC layer 12 may be accomplished, for example, by laterally etching it. Any suitable carbon layer shrink technique may be used, such as one based on a selective wet etch chemistry, dry etch chemistry, or energetic plasma species. For instance, energetic plasma species of oxygen, hydrogen, and/or amine ($NH_2$) may be formed using appropriate precursor gases (e.g., $O_2$, $NH_3$, $H_2$, $N_2O$, CO, $CO_2$, etc.) and used to selectively thin the width of aC layer 12. The amount of undercut of aC layer 12 may be controlled, for instance, by controlling the degree of plasma non-directionality, which itself may be controlled, for example, by modulating pressure, plasma density, percentage of ions, and ion energy. Non-directionality control appears to improve when using in-situ RF plasma, as compared to using a remote plasma source.

Various carbon layer shrink techniques are known in the art, but, such carbon layer shrink techniques have been previously used only to shrink carbon-based hard masks, such as to achieve sublithographic critical dimensions. After shrinking a carbon-based hard mask and using the shrunken carbon-based hard mask to pattern layers beneath it, the shrunken carbon-based hard mask conventionally is then removed, such as by ashing, and the shrunken carbon-based hard mask does not become a permanent part of the microelectronic structure. In the embodiments of the present invention, however, aC layer 12 is shrunk and left in place to be integrated as a permanent component of memory cell 10.

Figure 6E:
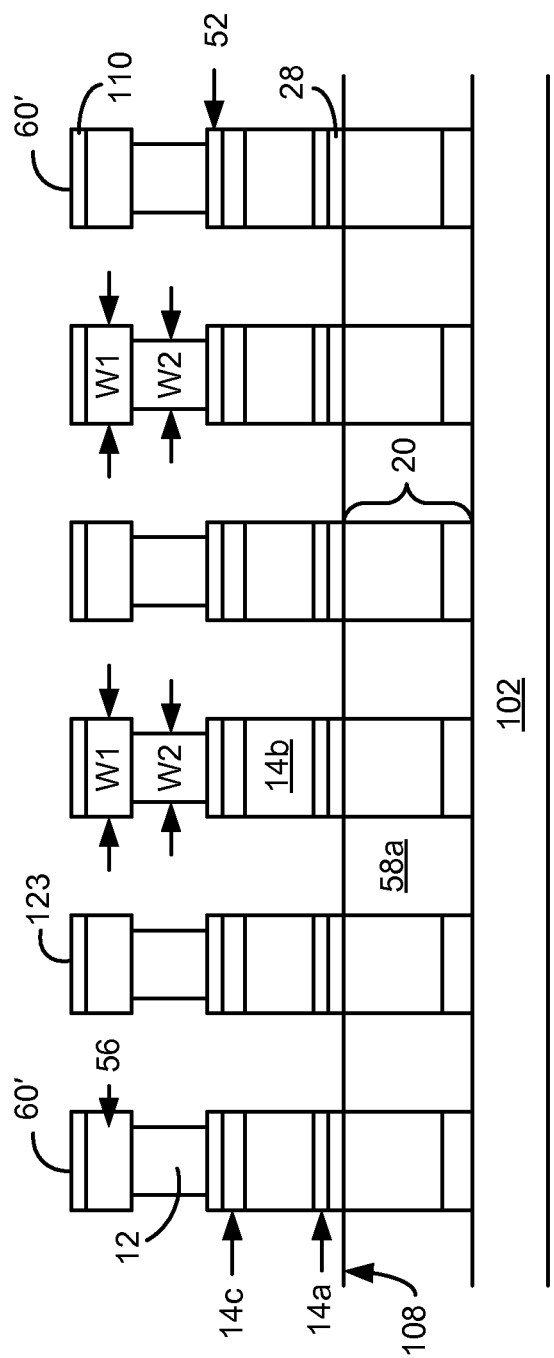

Pillars 123/oxide layer regions 110 are used as a hard mask to pattern and etch silicide-forming metal layer 52, and diode layers 14a-14c to form pillars 60' having a width W1, resulting in the structure illustrated in FIG. 6E. For example, initially, silicide-forming metal layer 52 is etched. The etch continues, etching diode regions 14c, 14b and 14a, and barrier layer 28. Each pillar 60' includes a reversible resistance switching layer 12 having a width W2, and a p-i-n, downward-pointing diode 14 having a width W1, with W2 less than W1. Persons of ordinary skill in the art will understand that upward-pointing p-i-n diodes may be similarly formed.

Figure 6F:
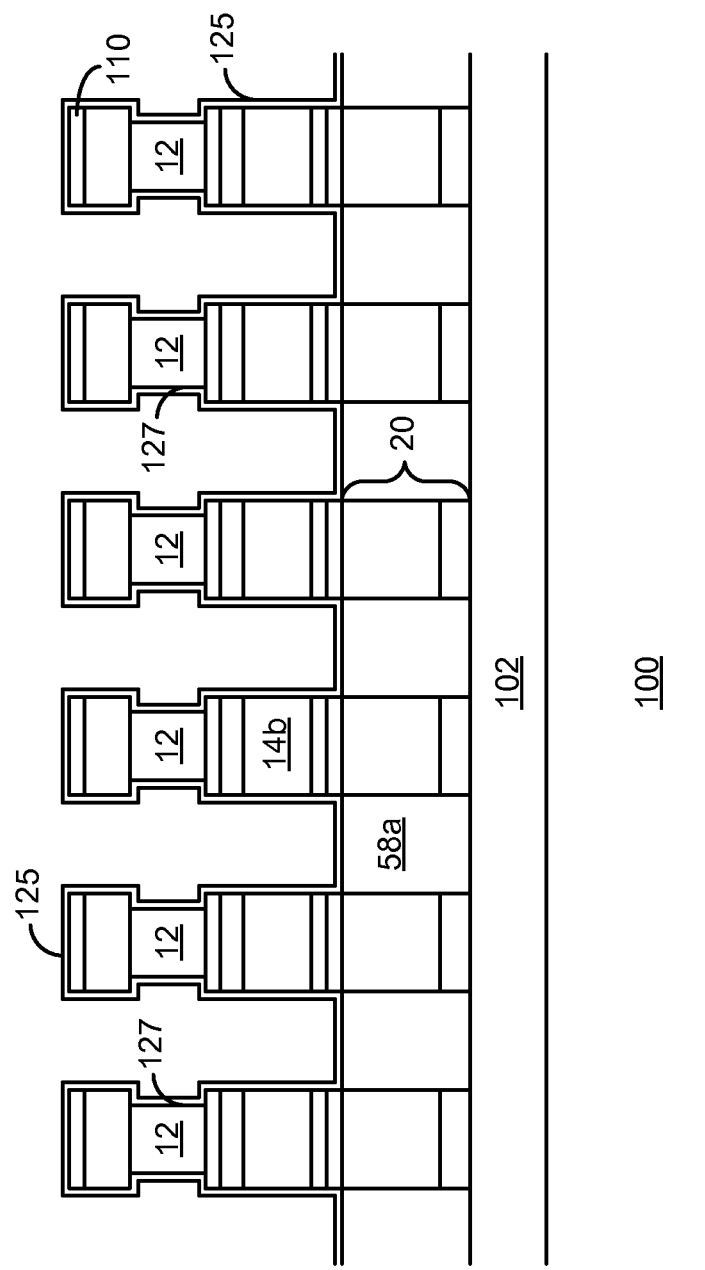
Figure 6G:
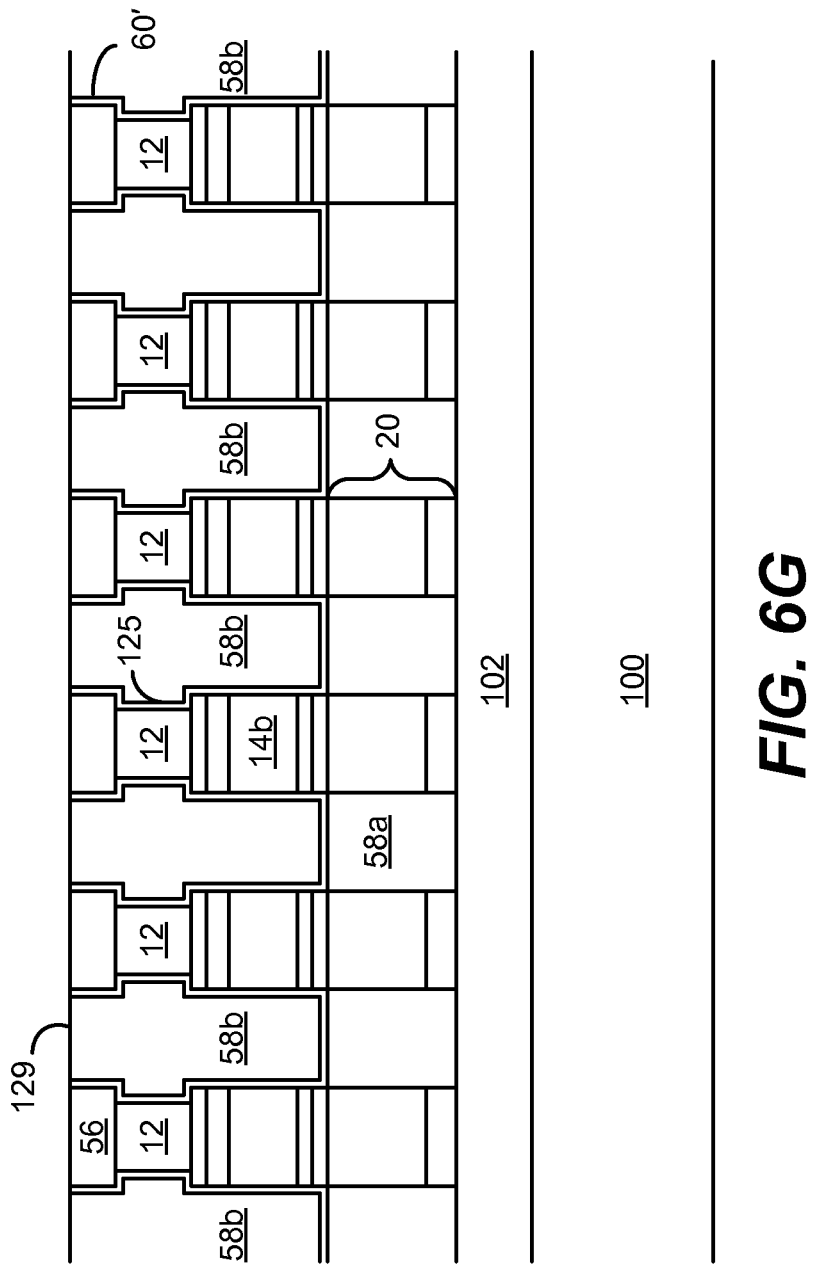

After the etch of pillars 60', the layer stack may be cleaned, and a dielectric sidewall liner 125 is deposited conformally over pillars 60', resulting in the structure illustrated in FIG. 6F. Dielectric sidewall liner 125 may be formed with an oxygen-poor deposition chemistry (e.g., without a high oxygen plasma component) to protect sidewalls 127 of the aC layer 12 during a subsequent deposition of an oxygen-rich gap-fill dielectric 58b (e.g., $SiO_2$) (not shown in FIG. 6F). For instance, dielectric sidewall liner 125 may comprise silicon nitride, and may comprise about 200 to about 500 angstroms of SiN. However, the structure optionally may comprise other layer thicknesses and/or other materials, such as $Si_xC_yN_z$ and $Si_xO_yN_z$ (with low O content), etc., where x, y and z are non-zero numbers resulting in stable compounds. Persons of ordinary skill in the art will understand that other dielectric materials may be used to form dielectric sidewall liner 125.

In one exemplary embodiment, a SiN dielectric sidewall liner 125 may be formed using the process parameters listed in Table 3. Liner film thickness scales linearly with time. Other powers, temperatures, pressures, thicknesses and/or flow rates may be used.

TABLE 3

PECVD SiN LINER PROCESS PARAMETERS

| PROCESS PARAMETER | EXEMPLARY RANGE | PREFERRED RANGE |
|---|---|---|
| SiH$_4$ Flow Rate (sccm) | 0.1-2.0 | 0.4-0.7 |
| NH$_3$ Flow Rate (sccm) | 2-10 | 3-5 |
| N$_2$ Flow Rate (sccm) | 0.3-4 | 1.2-1.8 |
| Temperature (° C.) | 300-500 | 350-450 |
| Low Frequency Bias (kW) | 0-1 | 0.4-0.6 |
| High Frequency Bias (kW) | 0-1 | 0.4-0.6 |
| Thickness (Angstroms) | 200-500 | 280-330 |

After dielectric sidewall liner 125 has been formed on pillars 60', a dielectric layer 58b is deposited over pillars 60' to fill the voids between pillars 60'. For example, approximately 2000-7000 angstroms of silicon dioxide may be deposited and planarized using chemical mechanical polishing or an etchback process to remove dielectric sidewall liner 125, dielectric layers 58b and 110 and form a planar surface 129, resulting in the structure illustrated in FIG. 6G. Planar surface 129 includes exposed top surfaces of pillars 60' separated by dielectric material 58b (as shown). Other dielectric materials such as silicon nitride, silicon oxynitride, low K dielectrics, etc., and/or other dielectric layer thicknesses may be used.

Figure 6H:
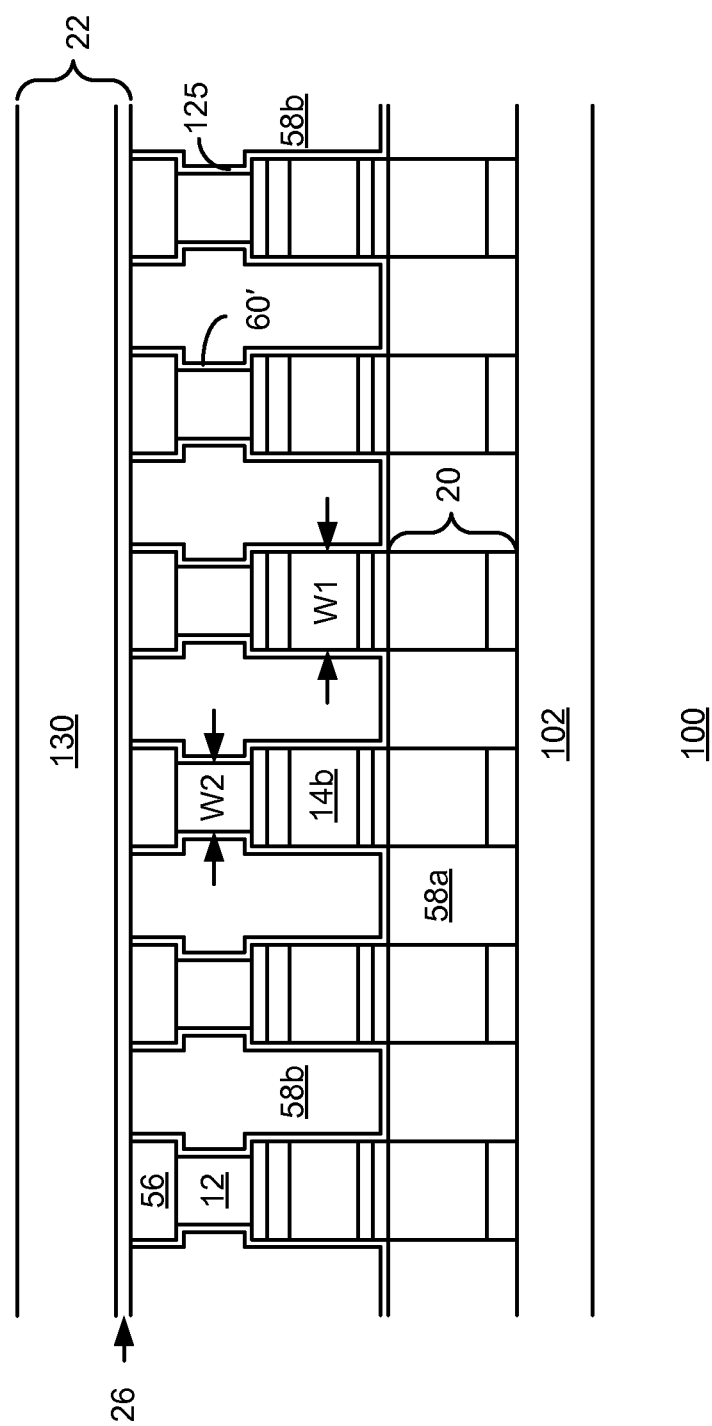

With reference to FIG. 6H, following planarization of dielectric layer 58b, second conductor 22 is formed above pillars 60' in a manner similar to the formation of first conductors 20. For example, in some embodiments, one or more barrier layers and/or adhesion layers 26 may be deposited over barrier layer 56 prior to deposition of a conductive layer 130 used to form second conductor 22.

Conductive layer 130 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s). The deposited conductive layer 130 and barrier and/or adhesion layer 26, may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 130 (and/or a conductive seed, conductive fill and/or barrier layer if needed). Adhesion layer 26 and conductive layer 130 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 52 and p+ region 14c react may serve as "crystallization templates" or "seeds" during annealing for underlying deposited semiconductor material that forms diodes 14 (e.g., changing any amorphous semiconductor material to polycrystalline semiconductor material and/or improving overall crystalline properties of diodes 14). Lower resistivity diode material thereby is provided.

Figure 7A:
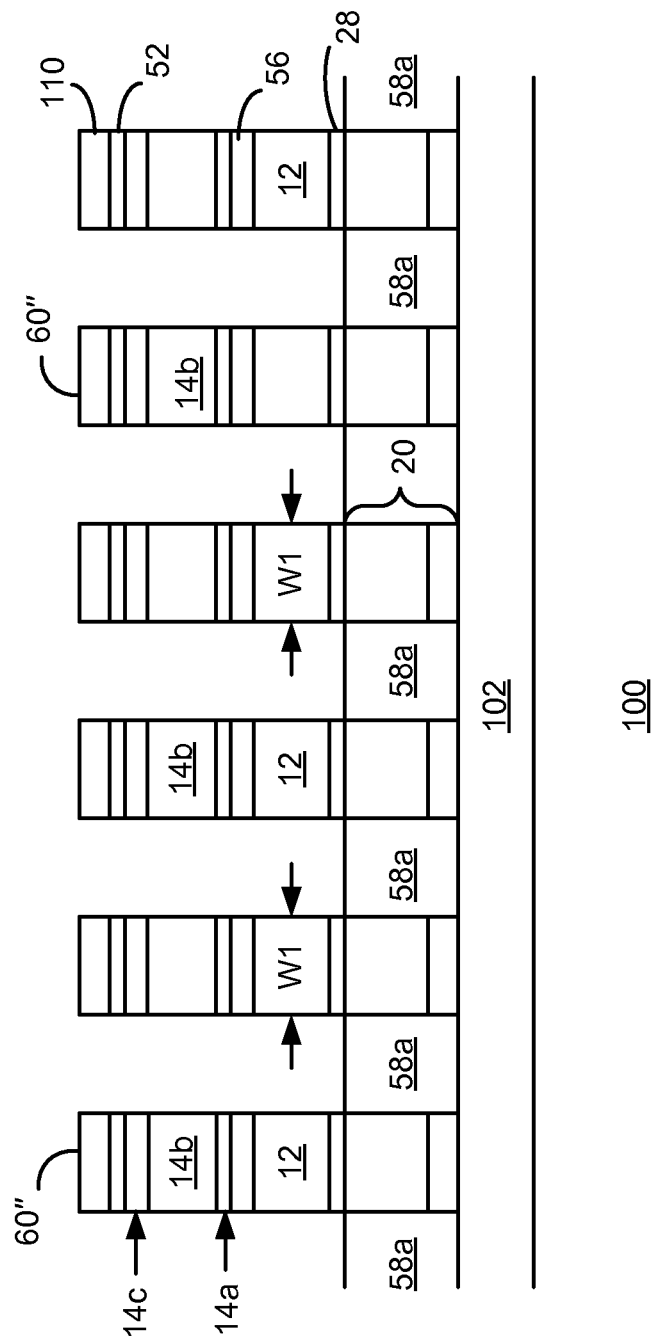
FIGS. 7A-7C illustrate cross-sectional views of a portion of a substrate during another alternative exemplary fabrication of a single memory level in accordance with this invention.
Figure 7B:
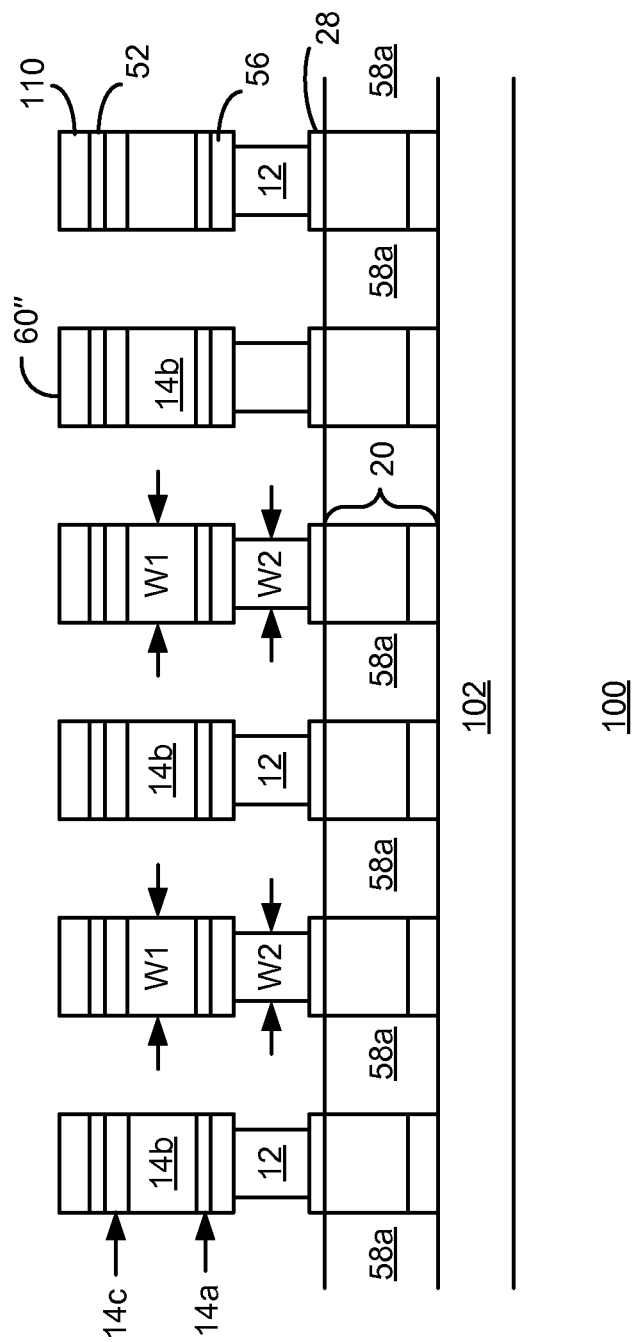
Figure 7C:
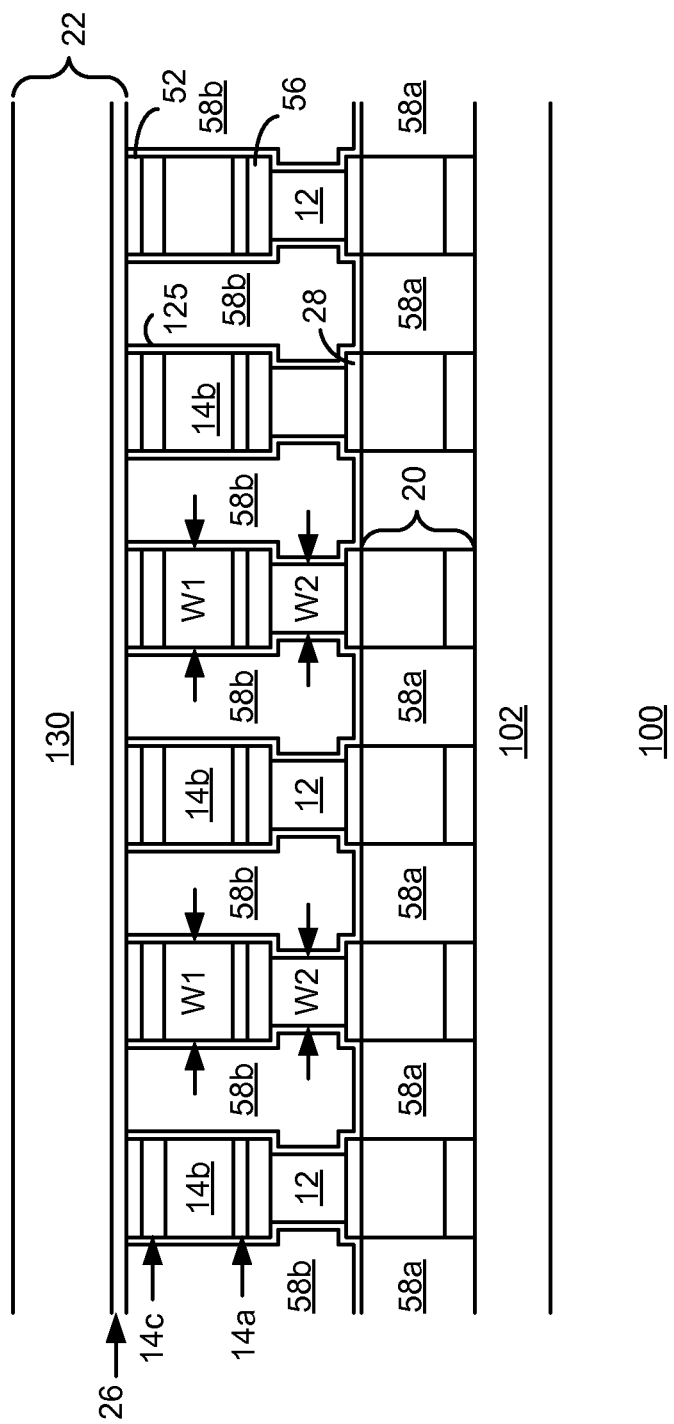

Persons of ordinary skill in the art will understand that alternative memory cells in accordance with this invention may be fabricated in other similar techniques. For example, as shown in FIG. 7A, pillars 60" having width W1 may be formed that include aC layer 12 below diode 14. Next, as shown in FIG. 7B, aC layer 12 is narrowed using a carbon layer shrink technique to form aC regions 12 having a width W2. As specified above, in various exemplary embodiments, W1 is between about 10 nm and about 100 nm, and W2 is between about 5 nm and about 50 nm. In other exemplary embodiments, W1 is between about 10 nm and about 45 nm, and W2 is between about 5 nm and about 20 nm. In at least one exemplary embodiment, W1 is about 43 nm and W2 is about 19 nm. In at least one alternative exemplary embodiment, W1 is about 24 nm and W2 is about 12 nm. Other W1 and/or W2 values may be used. As shown in FIG. 7C, subsequent steps include conformal deposition of dielectric sidewall liner 125, dielectric 58 backfill and planarization to remove dielectric layer 110, followed by formation of second conductors 22 above pillars 60".

The foregoing description discloses only exemplary embodiments of the invention. Modifications of the above disclosed apparatus and methods which fall within the scope of the invention will be readily apparent to those of ordinary skill in the art. For instance, in any of the above embodiments, the carbon-based resistivity switching material may be located below the diodes 14. As stated, although the invention has been described primarily with reference to amorphous carbon, other carbon-based resistivity switching materials may be similarly used. Further, each carbon-based switching layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell, the method comprising:
forming a steering element having a first width;
forming a silicide-forming metal adjacent the steering element;
forming a reversible resistance switching element coupled to the steering element;
forming a masking feature;
shrinking the masking feature to a width less than the first width;
reducing a width of the reversible resistance switching element to a second width substantially equal to the shrunken masking feature width by employing the shrunken mask feature;

forming a hard mask above the reversible resistance switching element;

using the shrunken masking feature to pattern and etch the hard mask to a width substantially equal to the shrunken masking feature width; and forming a liner on exterior surfaces of the hard mask and the reduced-width reversible resistance switching element, so that a width of the hard mask, reversible resistance switching element and liner substantially equals the first width, wherein reducing comprises using the etched hard mask to pattern and etch the reversible resistance switching element to the second width.

2. The method of claim 1, wherein the masking feature comprises photoresist.

3. The method of claim 2, wherein shrinking comprises using an oxygen plasma to shrink the photoresist masking feature.

4. The method of claim 1, wherein reducing comprises using the shrunken masking feature to pattern and etch the reversible resistance switching element to the second width.

5. The method of claim 1, further comprising using the liner, hard mask and reversible resistance switching element to pattern and etch the steering element to the first width.

6. The method of claim 1, wherein forming the steering element comprises forming a p-n or p-i-n diode.

7. The method of claim 1, wherein the first width comprises a minimum photolithography feature size of a semiconductor process.

8. The method of claim 1, wherein the first width between about 10 nanometers to about 100 nanometers.

9. The method of claim 1, wherein the first width is between about 10 nanometers to about 50 nanometers.

10. The method of claim 1, wherein the first width is about 43 nanometers.

11. The method of claim 1, wherein the reversible resistance switching element comprises amorphous carbon.

12. The method of claim 1, wherein the second width is between about 5 nanometers to about 50 nanometers.

13. The method of claim 1, wherein the second width is between about 5 nanometers to about 20 nanometers.

14. The method of claim 1, wherein the second width is about 19 nanometers.

15. A memory cell formed using the method of claim 1.

16. A method of forming a memory cell, the method comprising:

forming a steering element having a first width;

forming a silicide-forming metal adjacent the steering element;

forming a cavity adjacent the steering element, wherein the cavity has a width smaller than the first width; and using the cavity to form a reversible resistance switching element coupled to the steering element, wherein the reversible resistance switching element has a second width substantially equal to the cavity width, wherein forming a cavity comprises:

forming a sacrificial layer adjacent the steering element;

patterning and etching the sacrificial layer and the steering element to the first width;

forming a dielectric layer adjacent the etched sacrificial layer and steering element;

removing the sacrificial layer to form a void in the dielectric layer; and forming a liner inside the void to form the cavity.

17. The method of claim 16, wherein forming the liner comprises forming a liner having a bottom portion adjacent a bottom of the void and sidewall portions adjacent sidewalls of the void.

18. The method of claim 17, wherein the liner further comprises removing the bottom portion of the liner.

19. The method of claim 18, further comprising forming the reversible resistance switching element between the sidewall portions of the liner.

* * * * *